US011068099B2

(12) United States Patent
Kim et al.

(10) Patent No.: US 11,068,099 B2
(45) Date of Patent: Jul. 20, 2021

(54) TOUCH SENSOR AND DISPLAY DEVICE INCLUDING THE SAME

(71) Applicant: Samsung Display Co., Ltd., Yongin-si (KR)

(72) Inventors: Jung Hak Kim, Yongin-si (KR); Do Ik Kim, Yongin-si (KR); Young Sik Kim, Yongin-si (KR); Sang Chul Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/889,079

(22) Filed: Jun. 1, 2020

(65) Prior Publication Data

US 2020/0293139 A1    Sep. 17, 2020

Related U.S. Application Data

(63) Continuation of application No. 16/036,090, filed on Jul. 16, 2018, now Pat. No. 10,705,635.

(30) Foreign Application Priority Data

Sep. 29, 2017   (KR) .......................... 10-2017-0127730

(51) Int. Cl.
*G06F 3/044*       (2006.01)
*G06F 3/041*       (2006.01)
(Continued)

(52) U.S. Cl.
CPC ............ *G06F 3/0412* (2013.01); *G06F 3/047* (2013.01); *G06F 3/0443* (2019.05);
(Continued)

(58) Field of Classification Search
CPC . G06F 2203/04106; G06F 2203/04111; G06F 2203/04112; G06F 3/0412;
(Continued)

(56) References Cited

U.S. PATENT DOCUMENTS 9,086,771 B2   7/2015   Pyo et al.
9,244,573 B2   1/2016   Ryu et al.
(Continued)

FOREIGN PATENT DOCUMENTS

KR   10-1617143 B1   5/2016
KR   10-1620463 B1   5/2016
(Continued)

*Primary Examiner* — Tony O Davis
(74) *Attorney, Agent, or Firm* — Lewis Roca Rothgerber Christie LLP

(57) ABSTRACT

A touch sensor includes a sensor unit having a first region including at least one pair of a first electrode and a second electrode, and a second region including at least two pairs of first electrodes and second electrodes, a plurality of sensing channels each including first and second input terminals, wherein the first input terminals of the sensing channels are connected to different ones of the first electrodes, an amplifying circuit connected between the second input terminals of the sensing channels and the second electrodes, and an input control unit connected between the amplifying circuit and the second electrodes, the input control unit including a first resistor connected to the second electrode of the first region, and a second resistor commonly connected to the second electrodes of the second region.

20 Claims, 11 Drawing Sheets

(51) Int. Cl.
*G06F 3/047* (2006.01)
*H01L 27/32* (2006.01)
*H01L 51/52* (2006.01)
*G09G 3/3266* (2016.01)
*G09G 3/3275* (2016.01)
*G09G 3/20* (2006.01)

(52) U.S. Cl.
CPC .......... *G06F 3/0446* (2019.05); *G06F 3/0448* (2019.05); *G06F 3/04182* (2019.05); *G09G 3/20* (2013.01); *G09G 3/3266* (2013.01); *G09G 3/3275* (2013.01); *H01L 27/323* (2013.01); *H01L 27/3262* (2013.01); *H01L 27/3265* (2013.01); *H01L 27/3276* (2013.01); *H01L 51/5221* (2013.01); *H01L 51/5237* (2013.01); *G06F 3/04164* (2019.05); *G06F 2203/04106* (2013.01); *G06F 2203/04111* (2013.01); *G06F 2203/04112* (2013.01); *G09G 2300/0426* (2013.01); *G09G 2310/0267* (2013.01); *G09G 2310/0291* (2013.01); *G09G 2354/00* (2013.01)

(58) Field of Classification Search
CPC ............. G06F 3/04164; G06F 3/04182; G06F 3/0443; G06F 3/0446; G06F 3/0448; G06F 3/047; G09G 2300/0426; G09G 2310/0267; G09G 2310/0291; G09G 2354/00; G09G 3/20; G09G 3/3266; G09G 3/3275; H01L 27/323; H01L 27/3262; H01L 27/3265; H01L 27/3276; H01L 51/5221; H01L 51/5237

USPC .................................................. 345/170–178
See application file for complete search history.

(56) References Cited

U.S. PATENT DOCUMENTS

| | | |
|---|---|---|
| 9,275,611 B2 | 3/2016 | Kim |
| 2012/0092028 A1 | 4/2012 | Lee et al. |
| 2013/0257786 A1 | 10/2013 | Brown et al. |
| 2014/0111444 A1 | 4/2014 | Lindfors et al. |
| 2016/0202813 A1* | 7/2016 | Lee .................. G06F 3/04184 345/174 |
| 2016/0216798 A1* | 7/2016 | Kim .................. G06F 3/0445 |
| 2016/0266687 A1 | 9/2016 | Kim |
| 2017/0017348 A1 | 1/2017 | Ahn et al. |
| 2017/0075472 A1 | 3/2017 | Min et al. |
| 2018/0157355 A1* | 6/2018 | Kim .................. G06F 3/0446 |
| 2018/0224984 A1* | 8/2018 | Kim .................. G06F 3/0446 |
| 2018/0292930 A1* | 10/2018 | Lee .................. G06F 3/0445 |
| 2018/0321793 A1* | 11/2018 | Kim .................. G06F 3/04182 |
| 2018/0329576 A1* | 11/2018 | Kim .................. G06F 3/0446 |
| 2019/0332212 A1* | 10/2019 | Kim .................. H01L 27/323 |
| 2020/0110484 A1* | 4/2020 | Kim .................. G06F 3/041662 |
| 2020/0142563 A1* | 5/2020 | Kim .................. H01L 27/323 |
| 2020/0293139 A1* | 9/2020 | Kim .................. H01L 27/323 |
| 2020/0319735 A1* | 10/2020 | Kim .................. G06F 3/045 |

FOREIGN PATENT DOCUMENTS

| | | |
|---|---|---|
| KR | 10-1661454 B1 | 9/2016 |
| KR | 10-2017-0031303 A | 3/2017 |
| KR | 10-2018-0122761 | 11/2018 |

\* cited by examiner

TOUCH SENSOR AND DISPLAY DEVICE INCLUDING THE SAME

CROSS-REFERENCE TO RELATED APPLICATIONS

This application is a continuation of U.S. patent application Ser. No. 16/036,090, filed Jul. 16, 2018, which claims priority to and the benefit of Korean Patent Application No. 10-2017-0127730, filed Sep. 29, 2017, the entire content of both of which is incorporated herein by reference.

BACKGROUND

1. Field

An aspect of the present disclosure relates to a touch sensor and a display device including the same.

2. Description of the Related Art

Touch sensors may be used in display devices. For example, a touch sensor may be attached to one surface of a display panel, or may be integrally formed with the display panel, to sense a touch input.

SUMMARY

Embodiments provide a high-sensitivity touch sensor and a display device including the same.

According to an aspect of the present disclosure, there is provided a touch sensor including a sensor unit having a first region including at least one pair of a first electrode and a second electrode, and a second region including at least two pairs of first electrodes and second electrodes, a plurality of sensing channels each including first and second input terminals, wherein the first input terminals of the sensing channels are connected to different ones of the first electrodes, an amplifying circuit connected between the second input terminals of the sensing channels and the second electrodes, and an input control unit connected between the amplifying circuit and the second electrodes, the input control unit including a first resistor connected to the second electrode of the first region, and a second resistor commonly connected to the second electrodes of the second region.

The amplifying circuit may include an amplifier including an input terminal commonly connected to first ends of the first and second resistors, and a plurality of output resistors connected in parallel, connected to an output terminal of the amplifier, and respectively connected to different ones of the sensing channels.

The first resistor may be connected to the second electrode of the first region and to the input terminal of the amplifier, and the second resistor may be connected between the second electrodes of the second region and the input terminal of the amplifier.

The second input terminals of the sensing channels may be connected to respective ones of the output resistors.

The second region may include at least three first electrodes, wherein a second input terminal of a sensing channel connected to any one of the first electrodes of the second region is connected between second input terminals of sensing channels connected to two different ones of the first electrodes of the second region.

Each of the output resistors may be a variable resistor.

The sensor unit may further include a third region including at least one pair of a first electrode and a second electrode.

The input control unit may further include a third resistor connected between the second electrode of the third region and the amplifying circuit.

The amplifying circuit may include a first amplifier including an input terminal connected to the second electrode of the first region and to first end of the first resistor, and an output terminal connected to a second input terminal of a sensing channel connected to the first electrode of the first region, and a second amplifier including an input terminal connected to the second electrodes of the second region and to first end of the second resistor, and an output terminal connected to second input terminals of sensing channels connected to the first electrodes of the second region.

The amplifying circuit may include a first output resistor connected between the output terminal of the first amplifier and a second input terminal of a sensing channel connected to the first electrode of the first region, and a plurality of second output resistors connected between the output terminal of the second amplifier and second input terminals of the sensing channels connected to the second electrodes of the second region.

First ends of the first and second output resistors may be connected to a reference voltage source.

A first end of the first output resistor may be connected to the output terminal of the first amplifier, and the second end of the first output resistor is connected to the output terminal of the second amplifier.

First ends of the second output resistors may be commonly connected to the output terminal of the second amplifier, and the second ends of the second output resistors are commonly connected to an output terminal of a third amplifier or a reference voltage source.

The touch sensor may further include a third region including at least one second electrode connected to an input terminal of the third amplifier and at least one first electrode corresponding to the at least one second electrode, at least one sensing channel including a first input terminal connected to the first electrode of the third region, and a second input terminal connected to the output terminal of the third amplifier, and a third output resistor connected between the second input terminal of the sensing channel connected to the first electrode of the third region and the output terminal of the third amplifier.

A first end of the first resistor may be connected to the second electrode of the first region and the input terminal of the first amplifier, and the second end of the first resistor may be connected to a reference voltage source, and a first end of the second resistor may be connected to the second electrodes of the second region and the input terminal of the second amplifier, and the second end of the second resistor may be connected to the reference voltage source.

Each of the sensing channels includes a differential amplifier that may be configured to output a signal corresponding to a difference in voltage between the first and second input terminals.

The first and second electrodes may be provided to be spaced apart from each other, and a corresponding pair of the first and second electrodes may extend in a first direction in the first or second region while at least partially overlapping with each other.

The sensor unit may further include a plurality of third electrodes extending in a second direction to cross the first and second electrodes.

According to an aspect of the present disclosure, there is provided a display device including a display panel including a display region in which a plurality of pixels are provided, and a touch sensor including an active region, the active region including first and second regions overlapping with the display region, wherein the touch sensor includes at least one pair of a first electrode and a second electrode, which are provided in the first region, at least two pairs of first electrodes and second electrodes, which are provided in the second region, a plurality of sensing channels each including first and second input terminals, wherein the first input terminals of the sensing channels are connected to different ones of the first electrodes, an amplifying circuit connected between the second input terminals of the sensing channels and the second electrodes, and an input control unit connected between the amplifying circuit and the second electrodes, the input control unit including a first resistor connected to the second electrode of the first region and a second resistor commonly connected to the second electrodes of the second region.

The amplifying circuit may include at least one amplifier including an input terminal connected to the second electrodes of the first and second regions and the first and second resistors, and a plurality of output resistors connected in parallel to an output terminal of the amplifier, the plurality of output resistors being connected to different sensing channels among the sensing channels.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
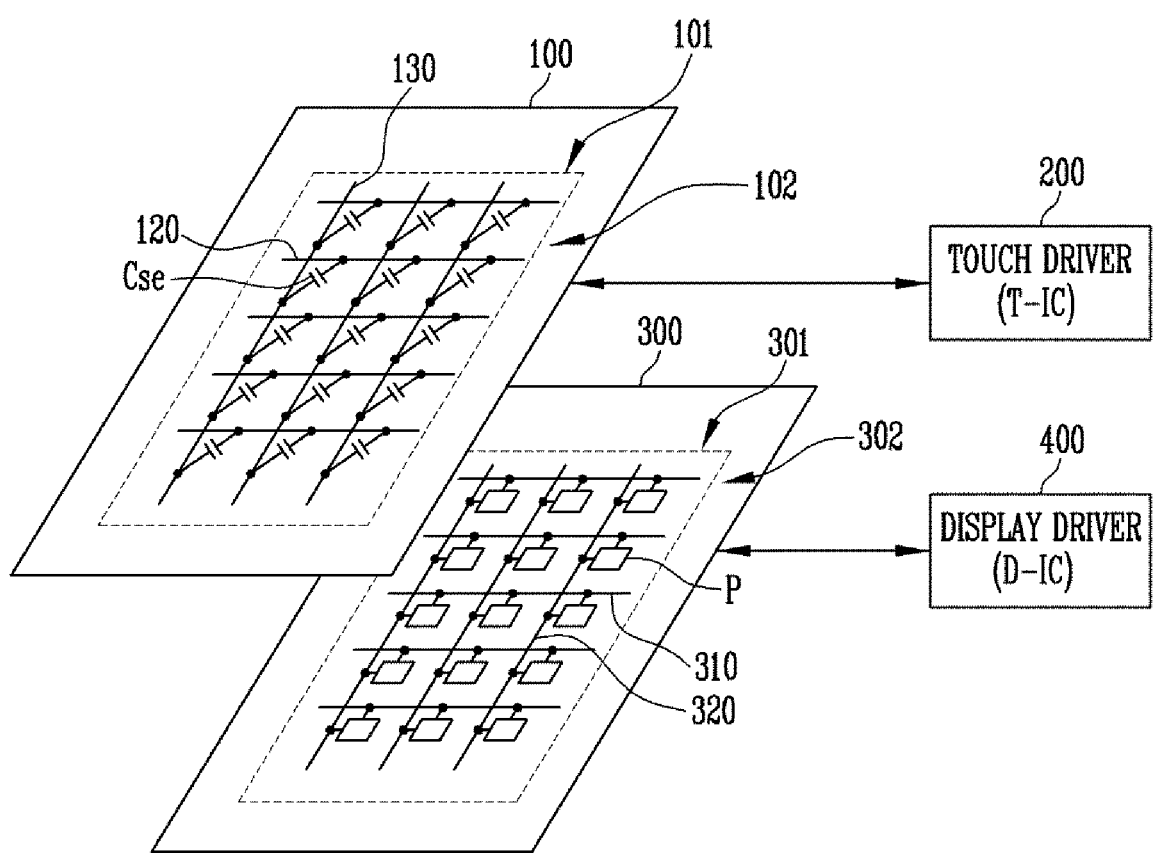
FIG. 1 schematically illustrates a display device according to an embodiment of the present disclosure.

Hereinafter, exemplary embodiments of the present disclosure will be described in detail with reference to the accompanying drawings. However, the present disclosure is not limited to the embodiments but may be implemented into different forms. These embodiments are provided only for illustrative purposes and for full understanding of the scope of the present disclosure by those skilled in the art. In the entire specification, when an element is referred to as being "connected" or "coupled" to another element, it can be directly connected or coupled to the another element or be indirectly connected or coupled to the another element with one or more intervening elements interposed therebetween.

Meanwhile, in the following embodiments and the attached drawings, elements not directly related to the present disclosure are omitted from depiction, and dimensional relationships among individual elements in the attached drawings are illustrated only for ease of understanding but not to limit the actual scale. It should note that in giving reference numerals to elements of each drawing, like reference numerals refer to like elements even though like elements are shown in different drawings.

Figure 2:
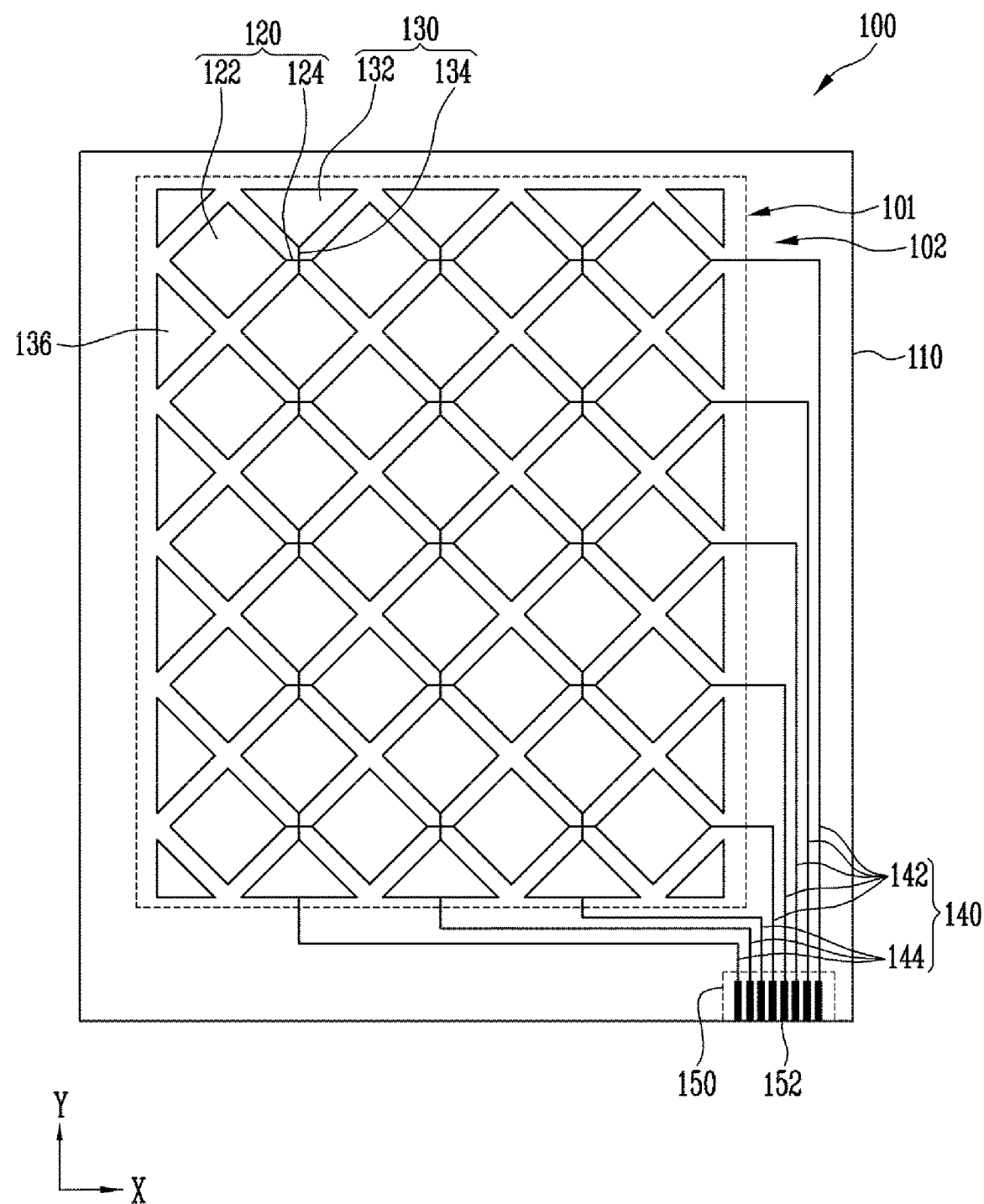
FIG. 2 illustrates a sensor unit of a touch sensor according to an embodiment of the present disclosure.

FIG. 1 schematically illustrates a display device according to an embodiment of the present disclosure. FIG. 2 illustrates a sensor unit of a touch sensor according to an embodiment of the present disclosure.

Referring to FIG. 1, the display device according to the present embodiment includes a sensor unit 100, a touch driver 200, a display panel 300, and a display driver 400. The sensor unit 100 and the touch driver 200 constitute a touch sensor.

Meanwhile, in the embodiment of FIG. 1, it is illustrated that the sensor unit 100 and the display panel 300 are separated from each other, but the present disclosure is not limited thereto. For example, the sensor unit 100 and the display panel 300 may be integrally manufactured.

In some embodiments, the sensor unit 100 may be provided on at least one region of the display panel 300. For example, the sensor unit 100 may be provided on at least one surface of the display panel 300 to overlap with the display panel 300. As an example, the sensor unit 100 may be located on one surface of the display panel 300 (e.g., an upper surface) in a direction in which an image is emitted.

In another embodiment, the sensor unit 100 may be directly formed on at least one surface between the surfaces of the display panel 300, or may be formed at the inside of the display panel 300. For example, the sensor unit 100 may be directly formed on an outer surface of an upper substrate (or encapsulation layer) or a lower substrate of the display panel 300 (e.g., an upper surface of the upper substrate or a lower surface of the lower substrate), or may be directly formed on an inner surface of the upper substrate or the lower substrate (e.g., a lower surface of the upper substrate or an upper surface of the lower substrate).

The sensor unit 100 includes an active region 101 capable of sensing a touch input, and a non-active region 102 surrounding at least a portion of the active region 101. In some embodiments, the active region 101 may be located to correspond to a display region 301 of the display panel 300, and the non-active region may be located to correspond to a non-display region 302 of the display panel 300. For example, the active region 101 of the sensor unit 100 may overlap with the display region 301 of the display panel 300, and the non-active region 102 of the sensor unit 100 may overlap with the non-display region 302 of the display panel 300.

In some embodiments, the active region 101 may be provided with at least one electrode for detecting a touch input (e.g., a plurality of sensing electrodes (first electrodes) 120 and a plurality of driving electrodes (third electrodes) 130). That is, the active region 101 may be a touch sensing region capable of sensing a touch input of a user.

In some embodiments, the sensing electrodes 120 and the driving electrodes 130 may be provided on the display region 301 of the display panel 300. In this case, the sensing electrodes 120 and the driving electrodes 130 may overlap with at least one electrode provided in the display panel 300. For example, when the display panel 300 is an organic light emitting display panel or a liquid crystal display panel, the sensing electrodes 120 and the driving electrodes 130 may overlap with at least a cathode electrode or common electrode of the display panel 300.

More specifically, the sensor unit 100 may include a plurality of sensing electrodes 120 and a plurality of driving electrodes 130, which are provided in the active region 101 to cross each other. As an example, the active region 101 may be provided with a plurality of sensing electrodes 120 each extending along a first direction (e.g., an X direction) and a plurality of driving electrodes 130 each extending in a second direction (e.g., a Y direction) to cross the sensing electrodes 120. In some embodiments, the sensing electrodes 120 and the driving electrodes 130 may be insulated from each other by at least one insulating layer.

Capacitances Cse are formed between the sensing electrodes 120 and the driving electrodes 130, for example, at crossing regions of the sensing electrodes 120 and the driving electrodes 130. Such a capacitance Cse is changed when a touch input occurs at a corresponding point or in the vicinity thereof. Thus, a touch input can be sensed by detecting a change in the capacitance Cse.

The shape, size and/or arrangement direction of the sensing electrodes 120 and the driving electrodes 130 are not particularly limited. In an unlimited embodiment related to this, the sensing electrodes 120 and the driving electrodes 130 may be configured as shown in FIG. 2. In FIGS. 1 and 2, a touch sensor using a mutual capacitance method will be disclosed as the touch sensor according to the present embodiment. However, the touch sensor according to the present embodiment is not necessarily limited to the touch sensor using the mutual capacitance method.

Referring to FIG. 2, the sensor unit 100 includes a base substrate 110 including an active region 101 and a non-active region 102, a plurality of sensing electrodes 120 and a plurality of driving electrodes 130, which are provided in the active region 101 on the base substrate 110, and a plurality of lines 140 and a pad unit 150, which are provided in the non-active region 102 on the base substrate 110. Meanwhile, in another embodiment of the present disclosure, the touch sensor may be implemented as a touch sensor using a self-capacitance method. In this case, a plurality of touch electrodes may be dispersed at coordinate points of the active region 101, respectively.

The base substrate 110 is a substrate that becomes a base member of the sensor unit, and may be a rigid substrate or a flexible substrate. For example, the base substrate 110 may be a rigid substrate made of glass or tempered glass, or a flexible substrate made of flexible plastic or metallic thin film. Meanwhile, in some embodiments, the base substrate 110 may be a display substrate constituting the display panel 300 or one of one or more insulating layers. For example, in an embodiment in which the sensor unit 100 and the display panel 300 are integrally implemented, the base substrate 110 may be at least one display substrate (e.g., an upper substrate) or a thin film encapsulation (TFE).

The sensing electrodes 120 may extend along a first direction, e.g., an X direction in the active region 101. In some embodiments, each of the sensing electrodes 120 may include a plurality of electrode cells 122 arranged along the first direction and at least one first connection part 124 connecting the first electrode cells 122 constituting the sensing electrode 120 along the first direction. In the present embodiment, the "connection" may comprehensively mean "connection" in physical and/or electrical aspects. When each of the sensing electrodes 120 includes three or more first electrode cells 122, each of the sensing electrodes 120 may include a plurality of first connection parts 124. In some embodiments, the first connection parts 124 may be integrally configured with the first electrode cells 122, or may be configured as bridge-type connection patterns.

Meanwhile, an embodiment in which the first connection parts 124 are located along the first direction is illustrated in FIG. 2, but the present disclosure is not limited thereto. For example, in another embodiment, the first connection parts 124 may be located in an oblique direction inclined with respect to the first direction. In addition, an embodiment in which the first connection parts 124 have a linear shape (or bar shape) is illustrated in FIG. 2, but the present disclosure is not limited thereto. In addition, an embodiment in which two adjacent first electrode cells 122 are connected to each other through one first connection part 124 located therebetween is illustrated in FIG. 2, but the present disclosure is not limited thereto. For example, in another embodiment, two adjacent first electrode cells 122 may be connected to each other through a plurality of first connection parts 124 located therebetween.

In some embodiments, the first electrode cells 122 and/or the first connection parts 124 may include at least one of a metallic material, a transparent conductive material, and other various conductive materials, thereby having conductivity. As an example, the first electrode cells 122 and/or the first connection parts 124 may include at least one of various metallic materials such as gold (Au), silver (Ag), aluminum (Al), molybdenum (Mo), chromium (Cr), titanium (Ti), nickel (Ni), neodymium (Nd), copper (Cu), and platinum (Pt), or any alloy thereof. Also, the first electrode cells 122 and/or the first connection parts 124 may include at least one of various transparent conductive material such as silver nano wire (AgNW), indium tin oxide (ITO), indium zinc oxide (IZO), antimony zinc oxide (AZO), indium tin zinc oxide (ITZO), zinc oxide (ZnO), tin oxide ($SnO_2$), carbon nano tube, and graphene. In addition, the first electrode cells 122 and/or the first connection parts 124 may include at least one of various conductive materials capable of providing conductivity. In some embodiments, the first electrode cells 122 and/or the first connection parts 124 may be provided in a single layer or a multi-layer.

In some embodiments, when the touch sensor according to the present embodiment is the touch sensor using the mutual capacitance method, the sensing electrodes 120 may output a sensing signal corresponding to a driving signal input to the driving electrodes 130. As an example, the sensing electrodes 120 may be Rx electrodes that output a sensing signal corresponding to a touch input to the touch driver 200.

The driving electrodes 130 may extend along a second direction, e.g., a Y direction in the active region 101. In some embodiments, each of the driving electrodes 130 may include a plurality of second electrode cells 132 arranged along the second direction, and at least one second connection part 134 connecting the second electrode cells 132 constituting the driving electrode 130 along the second direction. When each of the driving electrodes 130 includes three or more second electrode cells 132, each of the driving electrodes 130 may include a plurality of second connection parts 134. In some embodiments, the second connection parts 134 may be integrally configured with the second electrode cells 132, or may be configured as bridge-type connection patterns. When the touch sensor according to the present embodiment is the touch sensor using the mutual capacitance method, the driving electrodes 130 may be Tx electrodes that receive a driving signal from the touch driver 200 during a touch sensing period in which the touch sensor is activated.

Meanwhile, for convenience, a case where the first and second electrode cells 122 and 132 have a diamond shape is illustrated in FIG. 2, but the shape and size of the first and second electrode cells 122 and 132 may be variously changed. As an example, the first and second electrode cells 122 and 132 may have another shape such as a circular shape or a hexagonal shape. In another embodiment, each of the sensing electrodes 120 and the driving electrodes 130 may be implemented with an integrated bar-type electrode, etc.

In addition, an embodiment in which the second connection parts 134 are located in the second direction is illustrated in FIG. 2, but the present disclosure is not limited thereto. For example, in another embodiment, the second connection parts 134 may be located in an oblique direction inclined with respect to the second direction. In addition, an embodiment in which the second connection parts 134 have a linear shape (or bar shape) is illustrated in FIG. 2, but the present disclosure is not limited thereto. For example, in another embodiment, the second connection parts 134 may have a shape in which at least one region of each of the second connection parts 134 is curved or bent. In addition, an embodiment in which two adjacent second electrode cells 132 are connected to each other through one second connection part 134 located therebetween is illustrated in FIG. 2, but the present disclosure is not limited thereto. For example, in another embodiment, two adjacent second electrode cells 132 may be connected to each other through a plurality of second connection parts 134 located therebetween.

In some embodiments, the second electrode cells 132 and/or the second connection parts 134 may include at least one of a metallic material, a transparent conductive material, and other various conductive materials, thereby having conductivity. As an example, the second electrode cells 132 and/or the second connection parts 134 may include at least one of the conductive materials mentioned as the material constituting the first electrode cells 122 and/or the first connection parts 124. Also, the second electrode cells 132 and/or the second connection parts 134 may be made of the same material as the conductive material constituting the first electrode cells 122 and/or the first connection parts 124, or may be made of a material different from the conductive material constituting the first electrode cells 122 and/or the first connection parts 124. Also, each of the second electrode cells 132 and/or the second connection parts 134 may be provided in a single layer or a multi-layer.

In some embodiments, first dummy patterns 136 that are floated may be provided in at least one edge region of the active region 101. As an example, a plurality of first dummy patterns 136 that are floated in an island shape may be provided in both edge regions of the active region 101. Meanwhile, in another embodiment, the first dummy patterns 136 may be omitted or be connected in the first or second direction to constitute the sensing electrode 120 or the driving electrode 130.

In some embodiments, the lines 140 for electrically connecting the sensing electrodes 120 and the driving electrodes 130, which are provided in the active region 101, to the touch driver 200, etc. may be located in the non-active region 102. In some embodiments, the lines 140 may include first lines 142 for electrically connecting the respective sensing electrodes 120 to the pad unit 150, and second lines 144 for electrically connecting the respective driving electrodes 130 to the pad unit 150. For example, each of the lines 140 may electrically connect any one of the sensing electrodes 120 and the driving electrodes 130 to a corresponding pad 152 included in the pad unit 150.

Meanwhile, for convenience, a case where the first lines 142 and the second lines 144 are respectively connected to respective ends of the sensing electrodes 120 and the driving electrodes 130 is illustrated in FIG. 2. However, the connection structure between the sensing and driving electrodes 120 and 130 and the first and second lines 142 and 144 may be variously changed. For example, in another embodiment, at least one of the first lines 142 and the second lines 144 may be connected to both ends of the sensing electrodes 120 or the driving electrodes 130.

The pad unit 150 may include a plurality of pads 152 for electrically connecting the sensing electrodes 120 and the driving electrodes 130 to an external driving circuit, e.g., the touch driver 200. The sensor unit 100 and the touch driver 200 may communicate with each other through the pad unit 150.

Referring back to FIG. 1, the touch driver 200 is electrically connected to the sensor unit 100 to transmit/receive signals required to drive the sensor unit 100. As an example, the touch driver 200 may detect a touch input by supplying a driving signal to the sensor unit 100, and by then receiving a sensing signal corresponding to the driving signal from the sensor unit 100. To this end, the touch driver 200 may include a driving circuit and a sensing circuit. In some embodiments, the driving circuit and the sensing circuit may be integrated in one touch IC (T-IC), but the present disclosure is not limited thereto. Also, in some embodiments, the touch driver 200 along with the display driver 400 may be integrated as one driving IC.

In some embodiments, the driving circuit may be electrically connected to the driving electrodes 130 of the sensor unit 100 to sequentially supply a driving signal to the driving electrodes 130 during a touch sensing period. In some embodiments, the sensing circuit may be electrically connected to the sensing electrodes 120 of the sensor unit 100 to receive a sensing signal from the sensing electrodes 120, and to detect a touch input, based on the sensing signal.

The display panel 300 includes the display region 301, and a non-display region 302 surrounding at least one region of the display region 301. The display region 301 may be provided with a plurality of scan lines 310, a plurality of data lines 320, and a plurality of pixels P connected to the scan lines 310 and the data lines 320. The non-display region 302 may be provided with various driving signals for driving the pixels P and/or lines for supplying driving power.

In the present disclosure, the kind of the display panel 300 is not particularly limited. For example, the display panel 300 may be a self-luminescent display panel, such as an organic light emitting display panel (OLED panel). Alternatively, the display panel 300 may be a non-self-luminescent display panel such as a liquid crystal display panel (LCD panel), an electrophoretic display panel (EDP panel), or an electro-wetting display panel (EWD panel). When the display panel 300 is not a self-luminescent display panel, the display device may further include a backlight unit for supplying light to the display panel 300.

The display driver 400 is electrically connected to the display panel 300 to supply signals required to drive the display panel 300. As an example, the display driver 400 may include at least one of a scan driver for supplying a scan signal to the scan lines 310, a data driver for supplying a data signal to the data lines 320, and a timing controller for driving the scan driver and the data driver. In some embodiments, the scan driver, the data driver, and/or the timing controller may be integrated in one display IC (D-IC), but the present disclosure is not limited thereto. For example, in another embodiment, at least one of the scan driver, the data driver, and the timing controller may be equipped in the display panel 300.

As described above, the display device includes the touch sensor so that it is possible to provide convenience of use. For example, a user may easily control the display device by touching a screen while viewing an image displayed in the display region 301.

Figure 3:
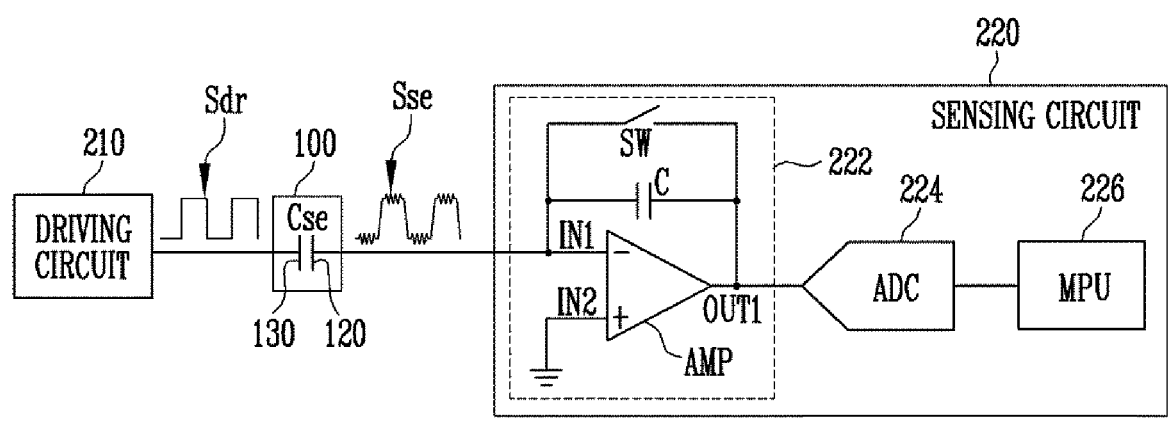
FIG. 3 illustrates a touch sensor according to an embodiment of the present disclosure.

FIG. 3 illustrates a touch sensor according to an embodiment of the present disclosure. For convenience, one sensing electrode and one driving electrodes among the sensing electrodes and the driving electrodes, which are provided in the sensor unit, and a capacitance formed at a crossing region thereof, will be illustrated in FIG. 3. In addition, based on the sensing electrode and the driving electrode, which form the capacitance, the driving circuit and the sensing circuit will be illustrated in FIG. 3.

Referring to FIG. 3, the sensor unit 100 may include at least one pair of a sensing electrode 120 and a driving electrode 130, which form a capacitance Cse. The driving electrode 130 is electrically connected to a driving circuit 210 of the touch driver 200, and the sensing electrode 120 is electrically connected to a sensing circuit 220 of the touch driver 200.

A driving method of the touch sensor according to the present embodiment will be described. During a touch sensing period in which the touch sensor is activated, a driving signal Sdr is supplied from the driving circuit 210 to the driving electrode 130. In some embodiments, the driving signal Sdr may be an AC signal having a given period, such as a pulse wave.

When the sensor unit 100 includes a plurality of driving electrodes 130, as shown in FIGS. 1 and 2, the driving circuit 210 may sequentially supply driving signals Sdr to the driving electrodes 130. Then, by coupling of the capacitance Cse, sensing signals Sse, which correspond to the driving signals Sdr applied to the driving electrodes 130, are output through the sensing electrodes 120, respectively. The sensing signals Sse are input to the sensing circuit 220.

In some embodiments, when the sensor unit 100 includes a plurality of sensing electrodes 120, as shown in FIGS. 1 and 2, the sensing circuit 220 may include a plurality of sensing channels (Rx channels) 222 electrically connected to the respective sensing electrodes 120. The sensing circuit 220 may receive sensing signals Sse from the sensing electrodes 120 through the sensing channels 222, respectively.

Meanwhile, in some embodiments, each of the sensing electrodes 120, along with an amplifier (hereinafter, referred to as an "Rx amplifier AMP") connected to the sensing electrode 120, may constitute each sensing channel 222. However, for convenience of illustration, a case where the sensing electrodes 120 provided in the sensor unit 100 are distinguished from the sensing channels 222 provided in the sensing circuit 220 will be described below.

The sensing circuit 220 amplifies, converts, and processes sensing signals Sse input from the respective sensing electrodes 120, and detects a touch input based on the result. To this end, the sensing circuit 220 may include a plurality of sensing channels 222 corresponding to the respective sensing electrodes 120, and at least one analog-to-digital converter (hereinafter, referred to as "ADC") 224 connected to the sensing channels 222, and a processor ("MPU") 226.

In some embodiments, each of the sensing channels 222 may be configured as an analog front end (hereinafter, referred to as "AFE") that receives a sensing signal from a sensing electrode 120 corresponding thereto. In some embodiments, each of the sensing channels 222 may be implemented as an AFE including at least one Rx amplifier AMP such as an operational amplifier (OP AMP).

In some embodiments, each of the sensing channels 222 may include a first input terminal IN1 (e.g., an inverting input terminal of the Rx amplifier AMP) and a second input terminal IN2 (e.g., a non-inverting input terminal of the Rx amplifier AMP). In some embodiments, the first input terminals IN1 of the sensing channels 222 may be connected to different sensing electrodes 120 among the sensing electrodes 120, respectively. That is, the sensing channels 222 and the sensing electrodes 120 may be connected one by one. In this case, a sensing signal Sse from any one of the sensing electrodes 120 may be input to the first input terminal IN1 of each of the sensing channels 222.

In some embodiments, the second input terminal IN2 of each of the sensing channels 222 may be a reference potential terminal. As an example, the second input terminal IN2 of each of the sensing channels 222 may be connected to a reference voltage source, such as a ground (GND) power source. In this case, each of the sensing channels 222 may amplify and output a sensing signal Sse input to the first input terminal IN1 based on the potential of the second input terminal IN2. That is, each of the sensing channels 222 receives a sensing signal Sse from a corresponding one of the sensing electrodes 120 through the first input terminal IN1, and amplifies and outputs a signal corresponding to the difference between voltages of the first input terminal IN1 and the second input terminal IN2, thereby amplifying the sensing signal Sse.

In some embodiments, the Rx amplifier AMP may be implemented with an integrator. In this case, a capacitor C and a reset switch SW may be connected in parallel between the first input terminal IN1 and an output terminal OUT1 of the Rx amplifier AMP.

The ADC 224 converts an analog signal input from each of the sensing channels 222 into a digital signal. In some embodiments, ADCs 224, which may be equal to or greater in number than the sensing electrodes 120, may correspond one-to-one to the sensing channels 222. Alternatively, in some embodiments, a plurality of sensing channels 222 may be configured to share one ADC 224. In this case, a switching circuit for channel selection may be additionally provided between the sensing channel 222 and the ADC 224.

The processor 226 processes the digital signals converted in the ADC 224, and detects a touch input based on the signal processing result. As an example, the processor 226 may detect whether a touch input has occurred, and may detect a position of the touch input by synthetically analyzing the signals (the amplified and digital-converted sensing signals Sse) input from the plurality of sensing electrodes 120 via the sensing channels 222 and the ADC 224. In some embodiments, the processor 226 may be implemented with a microprocessor (MPU). In this case, a memory required to drive the processor 226 may be additionally provided in the sensing circuit 220. Meanwhile, the configuration of the processor 226 is not limited thereto. As another example, the processor 226 may be implemented with a microcontroller (MCU), etc.

The touch sensor described above may be combined with the display panel 300, etc. As an example, the sensor unit 100 of the touch sensor may be integrally manufactured with the display panel 300, or may be attached onto at least one surface of the display panel 300 after the sensor unit 100 is manufactured separately from the display panel 300.

If the sensor unit 100 is combined with the display panel 300 as described above, a parasitic capacitance is generated between the sensor unit 100 and the display panel 300. As an example, the sensing electrode 120 and the driving electrode 130 of the sensor unit 100 may be located to overlap with the cathode electrode or common electrode of the display panel 300, and therefore, a parasitic capacitance is generated between the sensor unit 100 and the display panel 300.

A noise signal from the display panel 300 may be transferred to the touch sensor, for example, to the sensor unit 100, due to coupling of the parasitic capacitance. For example, a noise signal (e.g., a common mode noise) caused by a display driving signal applied to the display panel 300 may be introduced into the sensor unit 100.

As an example, in the display device according to the present embodiment, the display panel 300 may be an organic light emitting display panel including a TFE, and the sensor unit 100 may be configured with on-cell type sensor electrodes provided as the sensing electrodes 120 and the driving electrodes 130 directly formed on one surface (e.g., an upper surface) of the TFE. In this case, at least one electrode (e.g., a cathode electrode) provided in the organic light emitting display panel, the sensing electrodes 120, and the driving electrodes 130 are located adjacent to one another. Therefore, a noise signal caused by display driving may be transferred with a relatively large intensity to the sensor unit 100 as the display device is driven.

The noise signal transferred to the sensor unit 100 causes ripples of sensing signals Sse, and therefore, the sensitivity of the touch sensor may be decreased. Accordingly, the present disclosure provides various embodiments capable of increasing the sensitivity of the touch sensor, and their detailed descriptions will be described later.

Figure 4:
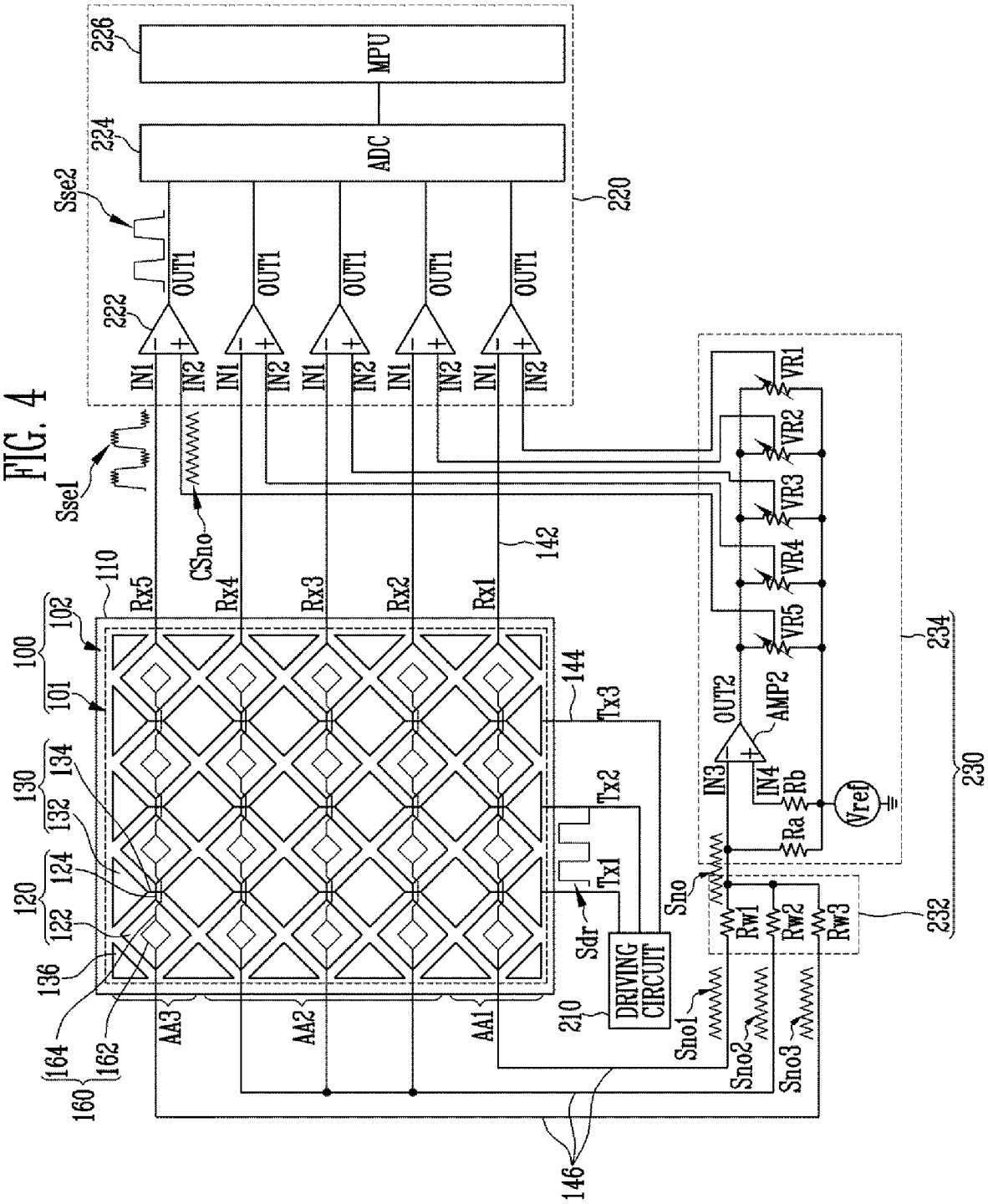
FIG. 4 illustrates a touch sensor according to an embodiment of the present disclosure.
Figure 5:
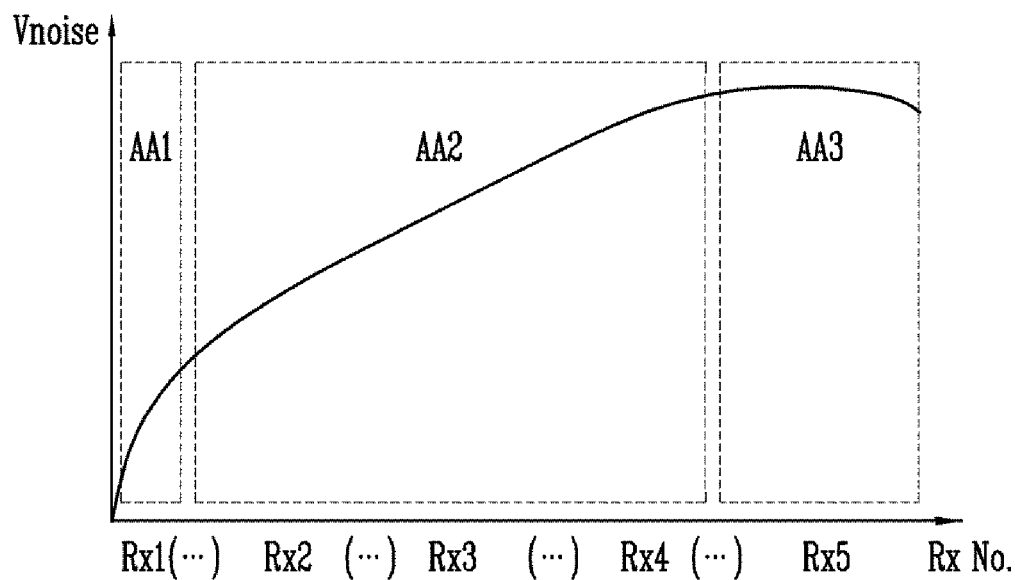
FIG. 5 illustrates a distribution characteristic of noise signals according to positions of a sensor unit shown in FIG. 4.

FIG. 4 illustrates a touch sensor according to an embodiment of the present disclosure. FIG. 5 illustrates a distribution characteristic of noise signals according to positions of the sensor unit shown in FIG. 4. For example, FIG. 5 illustrates intensities of noise signals introduced into the sensing channels through the sensing electrodes corresponding to the respective positions. For convenience, a case where each sensing channel is simplified is illustrated in FIG. 4. However, the sensing channel according to this embodiment may be configured substantially similar to, or identical to, the sensing channel shown in FIG. 3. Here, an input signal that is input to the second input terminal of the sensing channel may be different from that in the embodiment of FIG. 3. In FIG. 4, components similar to, or identical to, those of FIGS. 1 to 3 are designated by like reference numerals, and their detailed descriptions will not be repeated.

First, referring to FIG. 4, the touch sensor according to the present embodiment includes a sensor unit 100 including a plurality of sensing electrodes 120 and a plurality of driving electrodes 130, and a driving circuit 210 and a sensing circuit 220, which are electrically connected to the sensor unit 100. Also, the touch sensor according to the present embodiment further includes a plurality of noise detection electrodes (second electrodes) 160 provided in the sensor unit 100 to correspond to the respective sensing electrodes 120, and a noise control unit 230 connected between the noise detection electrodes 160 and sensing channels 222. In some embodiments, the noise control unit 230 may include an amplifying circuit 234 connected between the noise detection electrodes 160 and the sensing channels 222, and may include an input control unit 232 connected between the amplifying circuit 234 and the noise detection electrodes 160. Meanwhile, a case where the noise control unit 230 is provided separately from the sensing circuit 220 is illustrated in FIG. 4, but the present disclosure is not limited thereto. For example, at least a portion of the noise control unit 230 may be configured in the sensing circuit 220.

In an embodiment of the present disclosure, the sensor unit 100 is divided into at least two regions. For example, an active region 101 of the sensor unit 100 may be divided into a plurality of regions according to an intensity (voltage level) distribution of noise signals. As an example, the sensor unit 100 may include a first region (lower region) AA1, a second region (middle region) AA2, and a third region (upper region) AA3, which are sequentially arranged in a direction from the lower end to the upper end thereof.

In some embodiments, a large number of sensing electrodes 120 and a large number of driving electrodes 130 may be located in the sensor unit 100. However, for convenience, only some sensing electrodes 120 and some driving electrodes 130 will be illustrated in FIG. 4.

As an example, only one sensing electrode 120 among one or more (e.g., a plurality of) sensing electrodes 120 located in the first region AA1 is representatively illustrated in FIG. 4, and a sensing channel 222 connected to the sensing electrode 120 is referred to as a first sensing channel Rx1 (222). In addition, only three sensing electrodes 120 among two or more (e.g., a plurality of) sensing electrodes 120 located in the second region AA2 are representatively illustrated in FIG. 4, and sensing channels 222 connected to the sensing electrodes 120 are referred to as second, third, and fourth sensing channels Rx2, Rx3, and Rx4 (222), respectively. In addition, only one sensing electrode 120 among one or more (e.g., a plurality of) sensing electrodes 120 located in the third region AA3 is representatively illustrated in FIG. 4, and a sensing channel 222 connected to the sensing electrode 120 is referred to as a fifth sensing channel Rx5 (222).

Also, for convenience, only three driving electrodes 130 among driving electrodes 130 that traverse the first to third regions AA1 to AA3 are illustrated in FIG. 4, and driving channels connected to the driving electrodes 130 are referred to as first, second, and third driving channels Tx1, Tx2, and Tx3, respectively. The first, second, and third driving channels Tx1, Tx2, and Tx3 may be sequentially supplied with driving signals Sdr from the driving circuit 210 during a touch sensing period.

In some embodiments, noise components having different intensities may be included in sensing signals Sse1 input to the sensing channels Rx1 to Rx5 (222) according to positions of the sensor unit 100. As an example, as shown in FIG. 5, the intensity (or amplitude) of a noise signal (hereinafter, referred to as a "noise voltage Vnoise") detected by the sensor unit 100 may gradually increase as approaching from the first region AA1 toward the second region AA2 and the third region AA3.

For example, as a display noise caused by display driving is transferred to the sensor unit 100, a noise component corresponding to the display noise may be included in sensing signals Sse1 output from the sensor unit 100. For example, the display noise transferred to the sensing signals Sse1 may be generated according to a change in voltage of a cathode electrode (or a common electrode, etc.) located close to the sensor unit 100. The display noise may have different distribution forms depending on design structures of the display panel 300. However, the display noise may exhibit a form in which it gradually changes depending on positions of the display region 301 and the active region 101 corresponding thereto.

Accordingly, in an embodiment of the present disclosure, the sensor unit 100 is divided into a plurality of regions according to distribution characteristics of the noise voltage Vnoise detected by the sensor unit 100. As an example, the sensor unit 100 may be divided into first to third regions AA1 to AA3, based on inflection points shown in a distribution chart of noise voltages Vnoise. In addition, noise signals Sno1, Sno2, and Sno3 are detected for the respective regions by using the noise detection electrodes 160, and noise components (ripples) included in the sensing signals Sse1 output from the respective sensing electrodes 120 are cancelled and removed using the detected noise signals Sno1, Sno2, and Sno3.

In some embodiments, each of the first to third regions AA1 to AA3 includes at least one pair of a sensing electrode 120 and a noise detection electrode 160. That is, in an embodiment of the present disclosure, noise detection electrodes 160 are formed to respectively correspond to sensing electrodes 120. However, the present disclosure is not limited thereto. For example, in another embodiment, noise detection electrodes 160 may be formed at a distance (e.g., a predetermined distance) with respect to only some of a plurality of sensing electrodes 120.

In some embodiments, a pair of a sensing electrode 120 and a noise detection electrode 160, which correspond to each other, are located adjacent to each other in regions corresponding to each other, and may be physically and/or electrically separated from each other. As an example, at least one pair of a sensing electrode 120 and a noise detection electrode 160 extend in a first direction while at least one region of the sensing electrode 120 and the noise detection electrode 160 are overlapping with each other in each region (e.g., each of the first to third regions AA1 to AA3), and may be insulated from each other by an insulating layer or a space. That is, a pair of a sensing electrode 120 and a noise detection electrode 160, which correspond to each other, are arranged adjacent to each other. Thus, a noise signal Sno1, Sno2, or Sno3 having a substantially equal or similar form and/or intensity is transferred to the pair of the sensing electrode 120 and the noise detection electrode 160.

Meanwhile, the driving electrodes 130 cross the sensing electrodes 120 and the noise detection electrodes 160, and may be physically and/or electrically separated from the sensing electrodes 120 and the noise detection electrodes 160. That is, one region of at least some of the sensing electrodes 120, the driving electrodes 130, and the noise detection electrodes 160 may overlap with and/or cross each other, but may be insulated from each other by one or more insulating layers or spaces. Therefore, capacitances may be formed among the sensing electrodes 120, the driving electrodes 130, and the noise detection electrodes 160.

In some embodiments, each of the noise detection electrodes 160 may include a plurality of electrode parts 162 arranged along the first direction, and at least one connection line 164 connecting the electrode parts 162 along the first direction. In some embodiments, when each of the noise detection electrodes 160 includes three or more electrode parts 162, each of the noise detection electrodes 160 may include a plurality of connection lines 164. Meanwhile, the shape and/or configuration of the noise detection electrodes 160 is not limited thereto. As an example, in another embodiment, each of the noise detection electrodes 160 may be implemented as an integrated bar type electrode, etc.

In some embodiments, first electrode cells 122 and electrode parts 162 included in a pair of a sensing electrode 120 and a noise detection electrode 160, which correspond to each other, may overlap with each other. As an example, each of the electrode parts 162 may be located at a center of a region in which a first electrode cell 122 corresponding to each electrode part 162 is located while having an area smaller than the first electrode cell 122. However, the present disclosure is not limited thereto. For example, in another embodiment of the present disclosure, each first electrode cell 122 may have an opening corresponding to each electrode part 162, and each electrode part 162 may be located inside the opening formed in each first electrode cell to overlap with the opening. Additionally, in still another embodiment of the present disclosure, dummy patterns having a size and a shape, which are substantially equal or similar to those of the electrode parts 162, may be located to overlap with the second electrode cells 132, so that the active region 101 can be substantially uniformly viewed.

In some embodiments, the electrode parts 162 and/or the connection lines 164 may include at least one of a metallic material, a transparent conductive material, and other various conductive materials, thereby having conductivity. As an example, the electrode parts 162 and/or the connection lines 164 may include at least one of the conductive materials mentioned as the material constituting the first electrode cells 122, the first connection parts 124, the second electrode cells 132, and/or the second connection parts 134.

Also, the electrode parts 162 and/or the connection lines 164 may be located on the same layer as the first electrode cells 122, the first connection parts 124, the second electrode cells 132, and/or the second connection parts 134. As an example, when the first connection parts 124 are implemented as bridge patterns located on a layer different from that of the first and second electrode cells 122 and 132, the electrode parts 162 and the connection lines 164 may be located on the same layer as the first connection parts 124 while being spaced apart from the first connection parts 124. However, the material constituting the electrode parts 162 and/or the connection lines 164 and/or the arrangement positions of the electrode parts 162 and/or the connection lines 164 may be variously changed. In addition, each of the electrode parts 162 and/or the connection lines 164 may be provided in a single layer or a multi-layer, and the structure of each of the electrode parts 162 and/or the connection lines 164 is not particularly limited.

In some embodiments, noise signals from the noise detection electrodes 160 are transferred to the input control unit 232 and the amplifying circuit 234 through third lines 146 for the respective regions AA1, AA2, and AA3. That is, in an embodiment of the present disclosure, noise signals Sno1, Sno2, and Sno3 for the regions AA1, AA2, and AA3 are detected by connecting the noise detection electrodes 160 to the third lines 146 for the regions AA1, AA2, and AA3, respectively. Thus, although a plurality of noise detection electrodes 160, which are in number corresponding to that of the sensing electrodes 120, are additionally located in the sensor unit 100, the number of third lines 146 can be reduced or minimized. Accordingly, an increase in size of the non-active region 102 can be reduced or minimized. In addition, the number of third lines 146 is reduced or minimized so that it is possible to simplify the configuration of the noise control unit 230 connected to the noise detection electrodes 160 through the third lines 146. Accordingly, it is possible to reduce or minimize an increase in size of the touch driver 200 and an increase in manufacturing cost of the touch sensor.

The noise signals Sno1, Sno2, and Sno3 detected for the regions are input to the respective sensing channels 222 via the noise control unit 230. For example, the noise signals Sno1, Sno2, and Sno3 controlled while passing through the noise control unit 230 are input as noise compensation signals to second input terminals IN2 of the respective sensing channels 222.

For example, each of the sensing channels 222 includes first and second input terminals IN1 and IN2. In some embodiments, the first input terminals IN1 of the sensing channels 222 are connected to different sensing electrodes 120 among the sensing electrodes 120. In addition, the second input terminals IN2 of the sensing channels 222 are connected to the noise control unit 230. Each of the sensing channels 222 may be configured with a differential amplifier for amplifying and outputting a signal corresponding to a difference in voltage between the first and second input terminals IN1 and IN2. For example, each of the sensing channels 222 may amplify and output a sensing signal Sse1 input to the first input terminal IN1 based on the potential of a noise compensation signal CSno input to the second input terminal IN2.

That is, in an embodiment of the present disclosure, the sensing channels 222 do not operate based on a fixed reference potential (e.g., a ground potential) but may operate based on the potential of the noise compensation signal CSno. Therefore, the reference potential of the sensing channels 222 may change depending on the potential (voltage level) of the noise detection electrodes 160. According to the present embodiment, a noise component included in the sensing signal Sse1 can be cancelled in each of the sensing channels 222. Accordingly, a sensing signal Sse2 having a noise removed (or decreased) therefrom can be output.

For example, in an embodiment of the present disclosure, to improve or maximize noise cancellation, the noise control unit 230 including the input control unit 232 and the amplifying circuit 234 is connected between the noise detection electrodes 160 and the sensing channels 222. In some embodiments, the noise control unit 230 may be configured in the touch driver 200, but the position of the noise control unit 230 is not limited thereto.

In some embodiments, the input control unit 232 includes a plurality of resistors Rw1, Rw2, and Rw3 respectively corresponding to the regions AA1, AA2, and AA3 of the sensor unit 100. For example, the input control unit 232 may include a first resistor Rw1, a second resistor Rw2, and a third resistor Rw3, which correspond to the noise detection electrodes 160 of the respective first to third regions AA1, AA2, and AA3.

For example, each of the first and third resistors Rw1 and Rw3 may be connected to at least one noise detection electrode 160 provided in each of the first and third regions AA1 and AA3, and the second resistor Rw2 may be commonly connected to a plurality of noise detection electrodes 160 provided in the second region AA2. As an example, the first resistor Rw1 may be connected between the noise detection electrode 160 of the first region AA1 and a first input terminal (hereinafter, referred to as a "third input terminal IN3") of the amplifying circuit 234. In some embodiments, the third input terminal IN3 may be a first input terminal of an amplifier (hereinafter, referred to as a "noise amplifier AMP2") included in the amplifying circuit 234. In addition, the second resistor Rw2 may be connected between the noise detection electrodes 160 of the second region AA2 and the third input terminal IN3, and the third resistor Rw3 may be connected between the noise detection electrode 160 of the third region AA3 and the third input terminal IN3.

The input control unit 232 generates representative values of noise signals Sno1, Sno2, and Sno3 and transfers the representative values to the amplifying circuit 234 so that noise components included in sensing signals output from the sensing electrodes 120 can be effectively removed in the sensing channels 222. For example, at least a portion of the noise signals Sno1, Sno2, and Sno3 input from the first, second, and third regions AA1, AA2, and AA3 to the noise control unit 230 may have ripples caused by influence of a clock signal, etc., applied to the display panel 300, in addition to a display noise, e.g., a common mode noise that actually has influence on a change in voltage of the sensing electrodes 120.

Therefore, in an embodiment of the present disclosure, resistance values of the first to third resistors Rw1, Rw2, and Rw3 are set and/or controlled such that the wavelength of a representative noise signal Sno input to the amplifying circuit 234 is approximately as close as possible or feasible to that of the common mode noise that mainly constitutes the noise component of the sensing signal Sse1. As an example, when the wavelength of a noise signal (hereinafter, referred to as a "first noise signal Sno1") detected in the first region AA1 is an optimum noise signal that is approximate as close as possible to that of the common mode noise, the resistance values of the second resistor Rw2 and the third resistor Rw3 may be set to be relatively larger than that of the first resistor Rw1. Accordingly, the representative noise signal Sno output from the input control unit 232 can have a form similar to that of the first noise signal Sno1.

Also, in an embodiment of the present disclosure, a representative noise signal Sno is generated, to which the noise signals Sno1, Sno2, and Sno3 detected in the respective regions AA1, AA2, and AA3 of the sensor unit 100 through the input control unit 232 are synthetically reflected, and the noise component of the sensing signal Sse1 is removed using the representative noise signal Sno, so that a rapid noise compensation variation can be controlled to not be generated at a boundary between the regions AA1, AA2, and AA3. The representative noise signal Sno output from the input control unit 232 may be amplified via the amplifying circuit 234, and then input as a noise compensation signal CSno to each of the sensing channels 222.

In some embodiments, the amplifying circuit 234 may include at least one noise amplifier AMP2 and a plurality of output resistors VR1 to VR5 connected to an output terminal OUT2 of the noise amplifier AMP2. In some embodiments, the first input terminal (i.e., the third input terminal IN3) of the noise amplifier AMP2 may be commonly connected to respective ends of the first to third resistors Rw1, Rw2, and Rw3, and a second input terminal (hereinafter, referred to as a "fourth input terminal IN4") of the noise amplifier AMP2 may be connected to a reference voltage source Vref. In some embodiments, the third input terminal IN3 and the fourth input terminal IN4 may be an inverting input terminal and a non-inverting input terminal, respectively, but the present disclosure is not limited thereto. For example, in another embodiment, the third input terminal IN3 and the fourth input terminal IN4 may be set as a non-inverting input terminal and an inverting input terminal, respectively. Meanwhile, Ra and Rb of FIG. 4 equivalently illustrate input resistors/resistance formed between the noise amplifier AMP2 and the reference voltage source Vref. The noise amplifier AMP2 amplifies a representative noise signal Sno input from the input control unit 232, and outputs the representative noise signal Sno to each of the sensing channels 222.

In some embodiments, the plurality of output resistors VR1 to VR5 may be connected in parallel to the output terminal OUT2 of the noise amplifier AMP2. As an example, each of the output resistors VR1 to VR5 may be connected between the output terminal OUT2 of the noise amplifier AMP2 and the reference voltage source Vref.

In some embodiments, the output resistors VR1 to VR5 may be connected to the second input terminals IN2 of different sensing channels 222. As an example, output resistors VR1 to VR5, which are equal in number as, or greater in number than, the sensing channels 222, may be provided in the amplifying circuit 234 such that the sensing channels 222 can be connected one by one to the output resistors VR1 to VR5.

As described above, if the sensing channels 222 are connected to different output resistors VR1 to VR5, the magnitude (amplitude) of a noise compensation signal CSno input to each of the sensing channels 222 can be easily controlled to be suitable for the magnitude (amplitude) of a noise component included in a sensing signal Sse1 input to each of the sensing channels 222. That is, according to the present embodiment, the resistance value of each of the output resistors VR1 to VR5 can be independently set and/or controlled such that the noise component of the sensing signal Sse1 can be effectively removed (or reduced) in each of the sensing channels 222.

In some embodiments, each of the output resistors VR1 to VR5 may be configured as a variable resistor. In this case, the resistance values of the output resistors VR1 to VR5 can be changed when suitable. However, the present disclosure is not limited thereto. For example, in another embodiment, each of the output resistors VR1 to VR5 may have a fixed resistance value. For example, each of the output resistors VR1 to VR5 may have a resistance value fixedly set in a manufacturing process of the display device to be suitable in noise cancellation.

Sensing signals Sse2 that are amplified and have noise removed therefrom while passing through the sensing channels 222 may be input to at least one ADC 224 to be converted into digital signals, and then input to the processor 226. The processor 226 may detect a touch input based on the digital signals output from the ADC 224.

According to the present embodiment, a noise (for example, a common mode noise) introduced into the sensor unit 100 is detected using the noise detection electrodes 160, and a noise compensation signal CSno that is suitable for improving or maximizing the noise cancellation in each of the sensing channels is generated using the noise control unit 230. In addition, the noise compensation signal CSno is output to each of the sensing channels 222. Then, each of the sensing channels 222 is driven in a differential mode corresponding to a difference in voltage between the first and second input terminals IN1 and IN2, thereby removing a noise component included in a sensing signal Sse1. Accordingly, a display noise introduced into the sensor unit 100 of the touch sensor from the display panel 300, etc. can be effectively removed or reduced. According to the present embodiment, as the signal-to-noise ratio (SNR) of the touch sensor is increased, the malfunction of the touch sensor can be reduced or minimized, and the sensing sensitivity of the touch sensor can be improved.

Further, according to the present embodiment, the sensor unit 100 is divided into a plurality of regions (e.g., the first to third regions AA1 to AA3) according to distributions of noise signals, and noise signals Sno1, Sno2, and Sno3 are detected for the respective regions AA1 to AA3. Thus, the noise detection electrodes 160 and the noise control unit 230 can be efficiently configured. Accordingly, it is possible to reduce or minimize an increase in size of the non-active region 102 and the touch driver 200 due to the addition of the noise detection electrodes 160 and the noise control unit 230, and to reduce or minimize a corresponding manufacturing cost of the touch sensor.

The embodiment of the present disclosure may be usefully applied to display devices and the like, which have a short distance between the sensor unit 100 and the display panel 300. For example, the present embodiment may be usefully applied to improve touch sensitivity in on-cell type display devices and the like, which are sensitive to noise as the sensing electrodes 120 and the driving electrodes 130 are directly formed on the upper substrate or TFE of the display panel 300. In addition, because the present embodiment provides efficient structures of the noise detection electrodes and the noise control unit 230, the present embodiment may be usefully applied to large-sized display devices and the like. However, the scope of the present disclosure is not limited thereto, and it will be apparent that the present embodiment may be applied to various types of display devices or electronic devices.

Figure 6:
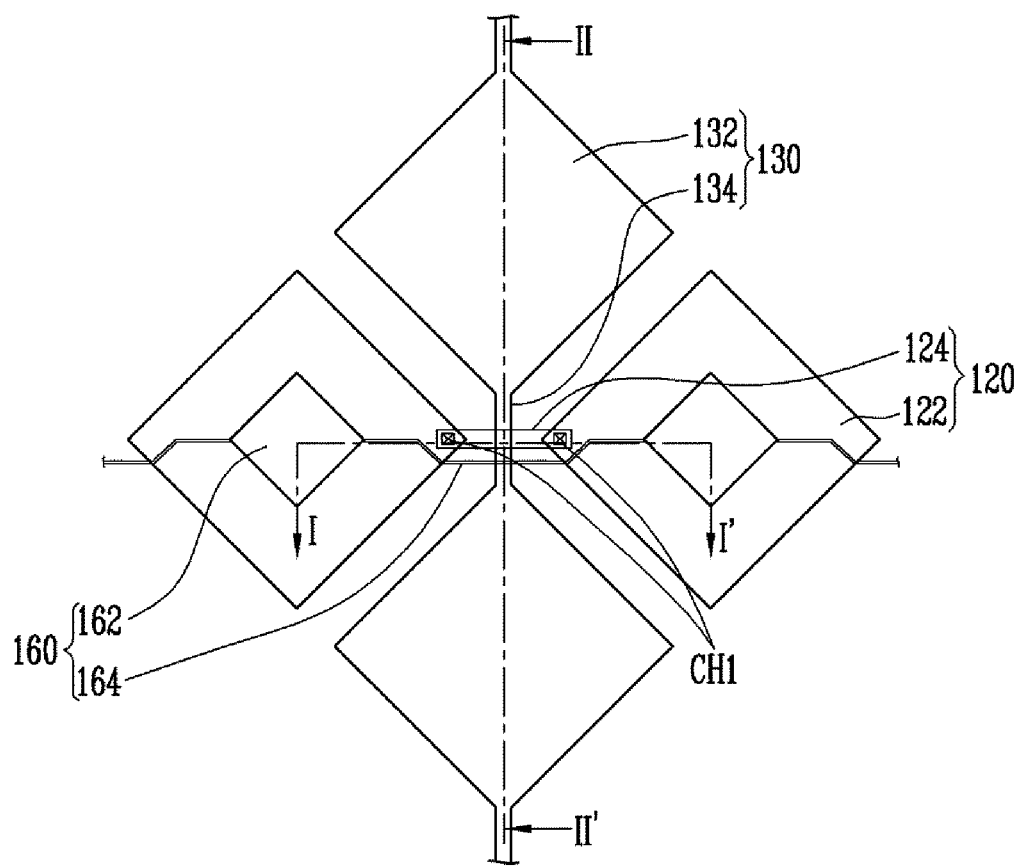
FIGS. 6 and 7 each illustrates an embodiment of the sensor unit shown in FIG. 4.
Figure 7:
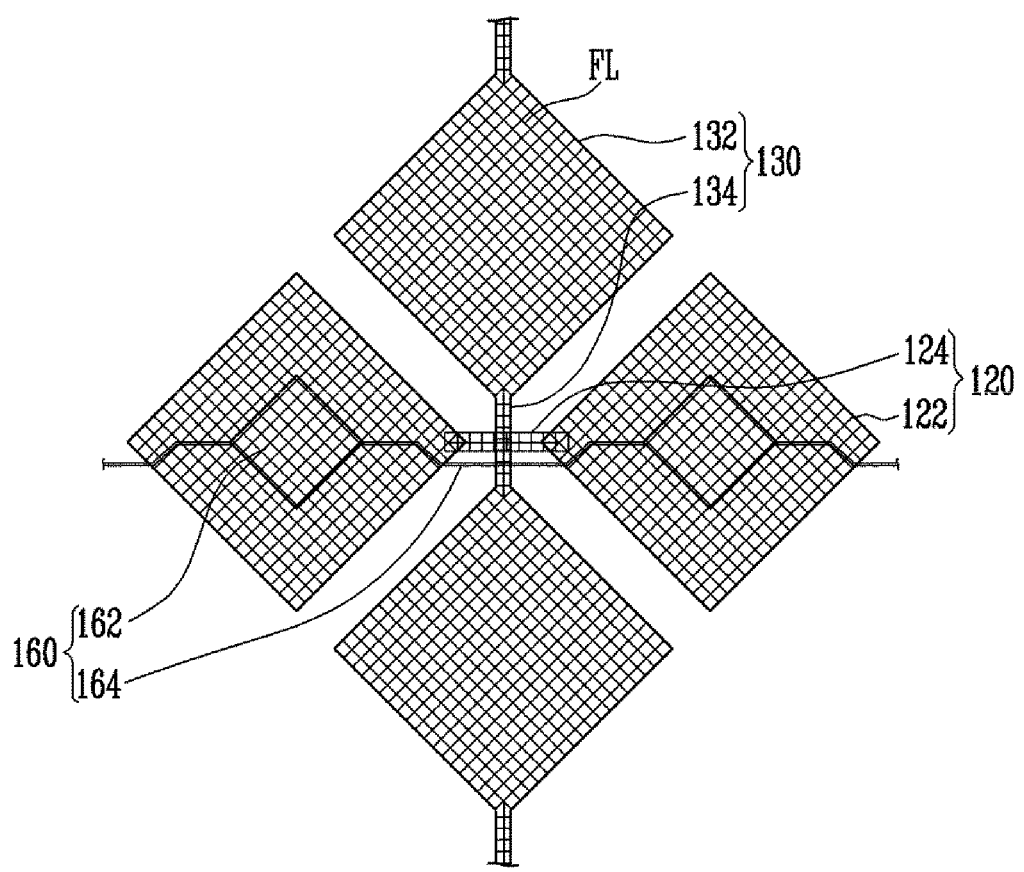
Figure 8A:
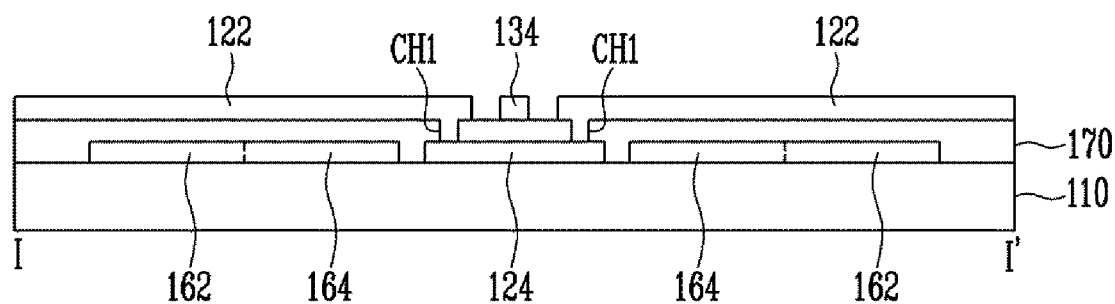
FIG. 8A illustrates an example of a section taken along the line I-I' of FIG. 6.
Figure 8B:
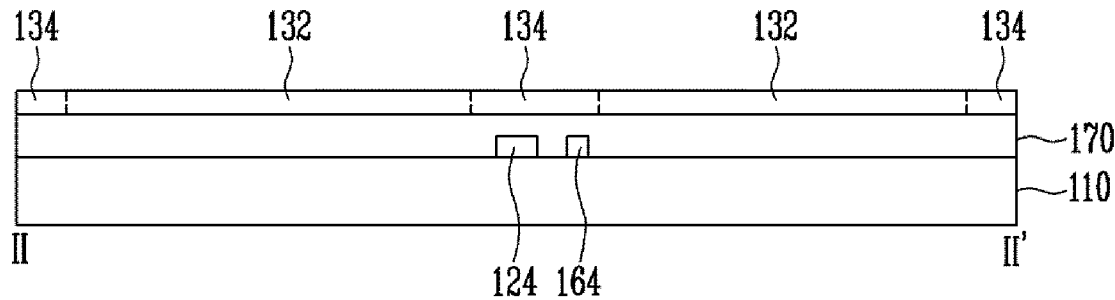
FIG. 8B illustrates an example of a section taken along the line II-II' of FIG. 6.
Figure 8C:
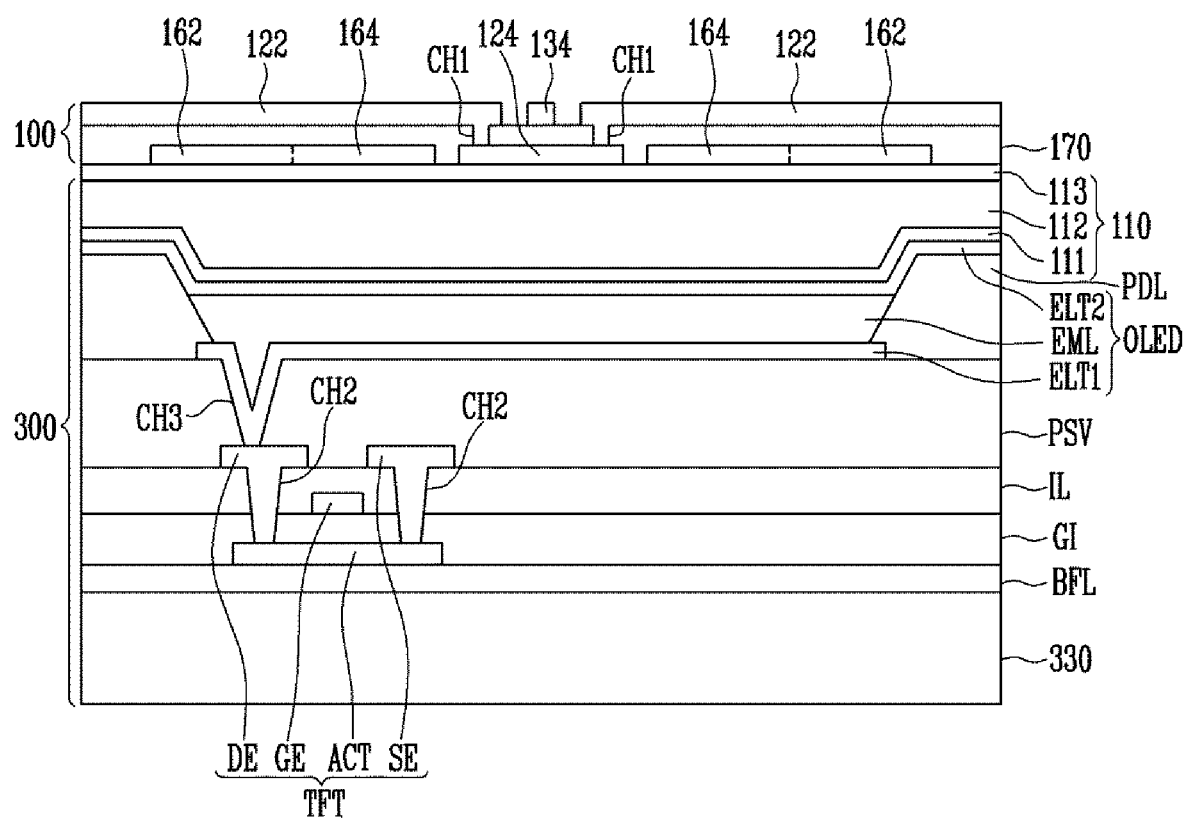
FIG. 8C illustrates an example of a section of a display device according to an embodiment of the present disclosure.

FIGS. 6 and 7 each illustrate an embodiment related to the sensor unit shown in FIG. 4. As an example, FIG. 7 illustrates a modification of the embodiment of FIG. 6. FIG. 8A illustrates an example of a section taken along the line I-I' of FIG. 6. FIG. 8B illustrates an example of a section taken along the line II-II' of FIG. 6. FIG. 8C illustrates an example of a section of a display device according to an embodiment of the present disclosure. For example, FIG. 8C illustrates an embodiment related to the arrangement structure of a sensor unit and a display panel. In FIGS. 6 to 8C, components similar or identical to those of FIG. 4 are designated by like reference numerals, and their detailed descriptions will not be repeated.

First, referring to FIGS. 6 to 8B, in some embodiments, the first electrode cells 122 and the second electrode cells 132 may be located on the same layer. In addition, one of the first connection parts 124 and the second connection parts 134 may be located on the same layer as the first and second electrode cells 122 and 132. As an example, the second connection parts 134 may be integrally connected to the second electrode cells 132.

Also, in some embodiments, the first connection parts 124 and the noise detection electrodes 160 may be provided on the same layer to be spaced apart from each other. For example, the first connection parts 124 and the electrode parts 162 may be provided on the same layer, and the connection lines 164 may be integrally connected to the electrode parts 162.

In some embodiments, the sensing electrodes 120 and the noise detection electrodes 160 may be insulated from each other by an insulating layer 170 provided therebetween. In addition, the first connection parts 124 and the second connection parts 134 may also be insulated from each other by the insulating layer 170. In this case, the first connection parts 124 may be connected to the first electrode cells 122 through first contact holes CH1.

The position, shape, and/or structure of each of the first electrode cells 122, the second electrode cells 132, the electrode parts 162, and the connection lines 164 may be variously modified and embodied. As an example, at least some of the first electrode cells 122, the second electrode cells 132, the electrode parts 162, and the connection lines 164 may be implemented with mesh-type electrodes and/or mesh-type patterns, each of which includes a plurality of conductive fine lines FL, as shown in FIG. 7.

Also, in some embodiments, a case where the first connection parts 124 are located on a lower layer of the layer on which the first and second electrode cells 122 and 132 are located is illustrated in FIGS. 8A and 8B, but the present disclosure is not limited thereto. For example, in another embodiment, the first connection parts 124 may be located on an upper layer of the layer on which the first and second electrode cells 122 and 132 are located.

Also, in some embodiments, a case where the electrode parts 162 are located on a lower layer (e.g., a layer on which the first connection parts 124 are located) of the layer on which the first and second electrode cells 122 and 132 are located is illustrated in FIGS. 8A and 8B, but the present disclosure is not limited thereto. For example, in another embodiment, the electrode parts 162 may be located on the same layer as the first and second electrode cells 122 and 132. As an example, the electrode parts 162 may be located in respective openings formed by having the centers of the first electrode cells 122 opened. In this case, the electrode parts 162 and the connection lines 164 may be located on different layers, and additional contact holes for connecting the electrode parts 162 and the connection lines may be formed in the insulating layer 170.

In the above-described embodiment, each of the electrode part 162 is located at the inside of a first electrode cell 122 corresponding thereto. Accordingly, it is possible to reduce or minimize interference between the driving electrodes 130 and the noise detection electrodes 160.

Meanwhile, in some embodiments, a base substrate 110 that becomes a base member of the sensor unit 100 may be a TFE of an organic light emitting display panel. In this case, the base substrate 110 may be provided in a multi-layer including at least one organic layer and at least one inorganic layer, or may be provided in a single layer including an organic-inorganic hybrid material. As an example, the base substrate 110 may be provided in a multi-layer including at least two inorganic layers and at least one organic layer interposed between the inorganic layers. In a display device in which the base substrate 110 is implemented as the TFE of the organic light emitting display panel, sensor patterns constituting the sensor unit 100, and display patterns constituting a display panel 300, may be located on different surfaces of the base substrate 110.

Hereinafter, an embodiment of the arrangement structure of the sensor patterns and the display patterns will be described with reference to FIG. 8C. For convenience, the structure of the sensor unit 100 is illustrated like the embodiment shown in FIG. 8A, but is not limited thereto. In FIG. 8C, a detailed description of the structure of the sensor unit 100 described above will not be repeated.

Referring to FIG. 8C, the sensor unit 100 may be directly formed and/or provided on a base substrate/TFE 110 of the display panel (e.g., an organic light emitting display panel) 300. Accordingly, a sensor-display integrated organic light emitting display panel can be provided. That is, in some embodiments, the above-described base substrate 110 may be the TFE of the display panel 300, and therefore, they are designated by the same reference numeral. For convenience, only a light emitting device (e.g., an organic light emitting diode) OLED and one thin film transistor TFT connected thereto among pixel patterns provided in each pixel region of the display panel 300 are illustrated in FIG. 8C.

In some embodiments, the display panel 300 includes a first substrate 330, a light emitting device OLED provided on one surface of the first substrate 330, and a TFE 110 provided over the light emitting device OLED to cover at least the light emitting device OLED. Also, in some embodiments, the display panel 300 may further include at least one thin film transistor TFT connected to the light emitting device OLED. In some embodiments, the thin film transistor TFT may be located between the first substrate 330 and the light emitting device OLED. In addition, the display panel 300 may further include at least one power line, at least one signal line, and/or at least one capacitor, and the like.

In some embodiments, the first substrate 330 may be a rigid substrate or a flexible substrate, and the material of the first substrate 330 is not particularly limited. As an example, the first substrate 330 may be a thin film substrate having flexibility. A buffer layer BFL may be provided on one surface of the first substrate 330. The buffer layer BFL may prevent an impurity from being diffused from the first substrate 330, and improve the flatness of the first substrate 330. In some embodiments, the buffer layer BFL may be provided in a single layer, but be provided in a multi-layer including at least two layers. In some embodiments, the buffer layer BFL may be an inorganic insulating layer made of an inorganic material. For example, the buffer layer BFL may be formed of silicon nitride, silicon oxide, silicon oxynitride, or the like. When the buffer layer BFL is provided in the multi-layer, the layers may be formed of the same material or be formed of different materials. Meanwhile, in another embodiment, the buffer layer BFL may be omitted.

The thin film transistor TFT is provided on the buffer layer BFL. The thin film transistor TFT includes an active layer ACT, a gate electrode GE, a source electrode SE, and a drain electrode DE. In some embodiments, the active layer ACT may be provided on the buffer layer BFL, and be formed of a semiconductor material. For example, the active layer ACT may be a semiconductor pattern made of poly-silicon, amorphous silicon, oxide semiconductor, or the like, and be formed of a semiconductor layer undoped or doped with an impurity. Alternatively, one region of the active layer ACT is undoped with the impurity, and the other region of the active layer ACT may be doped with the impurity.

In some embodiments, a gate insulating layer GI may be provided over the active layer ACT, and the gate electrode GE may be provided on the gate insulating layer GI. In addition, an interlayer insulating layer IL may be provided over the gate electrode GE, and the source electrode SE and the drain electrode DE may be provided on the interlayer insulating layer IL. The source electrode SE and the drain electrode DE may be connected to different regions of the active layer ACT through second contact holes CH2 passing through the gate insulating layer GI and the interlayer insulating layer IL, respectively.

In some embodiments, a passivation layer PSV may be provided over the source electrode SE and the drain electrode DE. The passivation layer PSV may cover the thin film transistor TFT and planarize a top surface of the thin film transistor TFT.

In some embodiments, the light emitting device OLED may be provided on the passivation layer PSV. The light emitting device OLED may include a first electrode ELT1, a second electrode ELT2, and an emitting layer EML interposed between the first and second electrodes ELT1 and ELT2. In some embodiments, the first electrode ELT1 of the light emitting device OLED may be an anode electrode, but the present disclosure is not limited thereto. The first electrode ELT1 of the light emitting device OLED is connected to one electrode, e.g., the drain electrode DE of the thin film transistor TFT through a third contact hole CH3 passing through the passivation layer PSV.

A pixel defining layer PDL that defines each pixel region (or a light emitting region of each pixel) is provided on one surface of the first substrate 330 on which the first electrode ELT1 of the light emitting device OLED is formed. In some embodiments, the pixel defining layer PDL may expose an upper surface of the first electrode ELT1, and protrude from the first substrate 330 along the circumference of each pixel region.

The emitting layer EML is provided in the pixel region surrounded by the pixel defining layer PDL. The emitting layer EML may be located on the exposed surface of the first electrode ELT1. In some embodiments, the emitting layer EML may have a multi-layered thin film structure including at least a light generation layer. For example, the emitting layer EML may include a hole injection layer, a hole transport layer, the light generation layer, a hole blocking layer, an electron transport layer, and an electron injection layer. In some embodiments, the color of light generated from the emitting layer EML may be one of red, green, blue, and white, but the present disclosure is not limited.

In some embodiments, the second electrode ELT2 of the light emitting device OLED may be located on the emitting layer EML. In some embodiments, the second electrode ELT2 of the light emitting device OLED may be a cathode electrode, but the present disclosure is not limited.

In some embodiments, the TFE 110 that covers the second electrode ELT2 of the light emitting device OLED may be provided over the second electrode ELT of the light emitting device OLED. When the display region 301 of the display panel 300 is sealed using the TFE 110, the thickness of the display panel is decreased, thereby ensuring flexibility.

In some embodiments, the TFE 110 may be provided in a multi- or single-layered structure. As an example, the TFE 110 may include a first inorganic layer 111 and a second inorganic layer 113, which overlap with each other, and an organic layer 112 interposed between the first and second inorganic layers 111 and 113. Alternatively, in another embodiment, the TFE 110 may be implemented as a single layer complexly including organic and inorganic materials.

In some embodiments, the organic layer 112 may have a thickness larger than that of the first and second inorganic layers 111 and 113. As an example, the organic layer 112 may have a thickness of about 4 μm to about 10 μm, and each of the first and second inorganic layers 111 and 113 may have a thickness of about 8000 Å to about 10000 Å.

In the display device according to the above-described embodiment, the display panel 300 is implemented as the organic light emitting display panel including the TFE 110, and the sensor patterns of the sensor unit 100 are directly formed on the TFE 110. For example, the sensing electrodes 120, the driving electrodes 130, and/or the noise detection electrodes 160 may be directly formed on the FTE 110.

In this case, the sensor patterns are located close to the display patterns provided in the display panel 300, for example, the second electrode ELT2 of the light emitting device OLED. Accordingly, a display noise (e.g., a common mode noise) from the second electrode ELT2 of the light emitting device OLED can be introduced into the sensor patterns. In the present disclosure, the noise detection electrodes 160 and the noise control unit 230 are configured as described above, thereby effectively cancelling the display noise. Thus, the sensitivity of the touch sensor can be sufficiently ensured even when the sensor-display integrated display panel is implemented as shown in FIG. 8, and the organic layer 112 of the TFE 110 is formed thin with a thickness of approximately 10 μm or less. For example, when the noise decrease/cancellation structure according to the present embodiment is applied, the sensitivity of the touch sensor can be sufficiently ensured even when the entire thickness of the TFE 110 is designed to be 10 μm or less.

Figure 9:
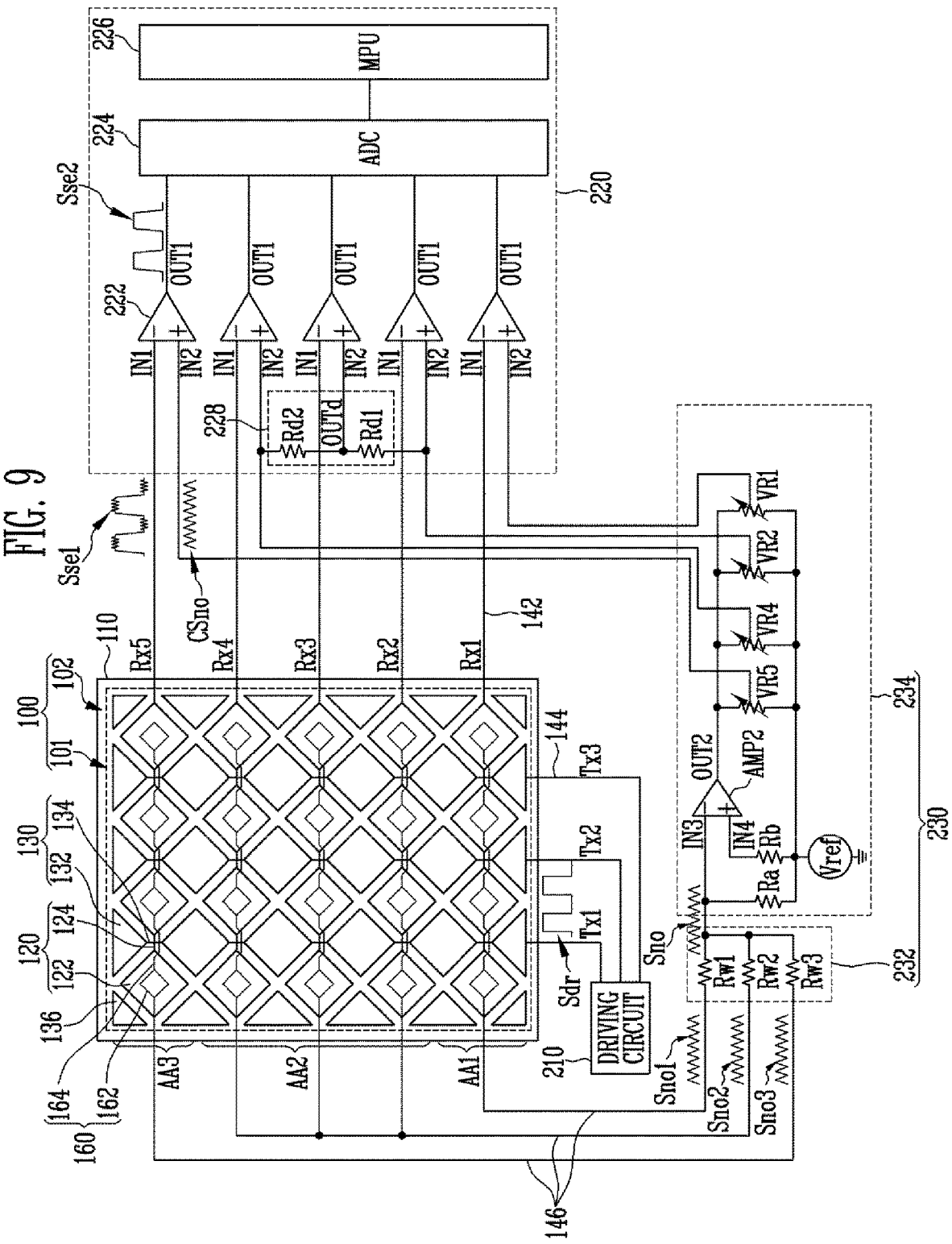
FIG. 9 illustrates a touch sensor according to an embodiment of the present disclosure.

FIG. 9 illustrates a touch sensor according to an embodiment of the present disclosure. For example, FIG. 9 illustrates a modification of the embodiment shown in FIG. 4. In FIG. 9, components similar or identical to those of FIG. 4 are designated by like reference numerals, and their detailed descriptions will not be repeated.

Referring to FIG. 9, a second input terminal IN2 of at least one of the sensing channels 222 may be connected between second input terminals IN2 of two different sensing channels 222 connected to different sensing channels 222, e.g., sensing electrodes 120 of the same region. For example, a third sensing channel Rx3 (222) connected to any one sensing electrode 120 located in the middle of the second region AA2 may be connected between second input terminals IN2 of vertically adjacent sensing channels, e.g., second and third sensing channels Rx2 and Rx4 (222).

For example, in some embodiments, a voltage divider 228 including at least first and second division resistors Rd1 and Rd2 may be provided between the second input terminals IN2 of the second and fourth sensing channels Rx2 and Rx4 (222), and the second input terminal IN2 of the third sensing channel Rx3 (222) may be connected to an output node OUTd of the voltage divider 228. Here, the first division resistor Rd1 may be connected between the second input terminals IN2 of the second and third sensing channels Rx2 and Rx3 (222), and the second division resistor Rd2 may be connected between the second input terminals IN2 of the third and fourth sensing channels Rx3 and Rx4 (222). Therefore, a noise compensation signal CSno corresponding to a middle value of noise compensation signals CSno input to the second input terminals IN2 of the second and fourth sensing channels Rx2 and Rx4 (222) may be input to the second input terminal IN2 of the third sensing channel Rx3 (222).

The intensity of a noise introduced into the sensor unit 100 has a form in which it is gradually changed depending on positions in the sensor unit 100. Thus, when voltages input to the second input terminals IN2 of the second and fourth sensing channels Rx2 and Rx4 (222) is divided, and a middle value of the voltages is supplied to the second input terminal IN2 of the third sensing channel Rx3 (222), a noise component included in a sensing signal Sse1 input to the third sensing channel Rx3 (222) can be effectively removed without providing the third output resistor VR3 of FIG. 4.

In the same manner, when a larger number of sensing electrodes 120 are arranged in the second region AA2, second input terminals IN2 of sensing channels 222 connected to a plurality of sensing electrodes 120 among the sensing electrodes 120 is connected between second input terminals IN2 of different sensing channels 222 through the voltage divider 228, so that the number of output resistors VR1, VR2, etc. can be decreased. In addition, when a plurality of sensing electrodes 120 are arranged in each of the first region AA1 and/or the third region AA3, the above-described manner is applied to the first region AA1 and/or the third region AA3, so that a display noise introduced into each sensing electrode 120 of the sensor unit 100 can be effectively removed while decreasing the number of output resistors VR1, VR2, etc. provided in the amplifying circuit 234.

According to the above-described embodiment, a noise introduced into the sensor unit 100 from the display panel 300, etc. can be effectively removed or reduced while simplifying the configuration of the amplifying circuit 234. Accordingly, it is possible to prevent an increase in size of the touch driver 200 and an increase in manufacturing cost of the touch sensor.

Figure 10:
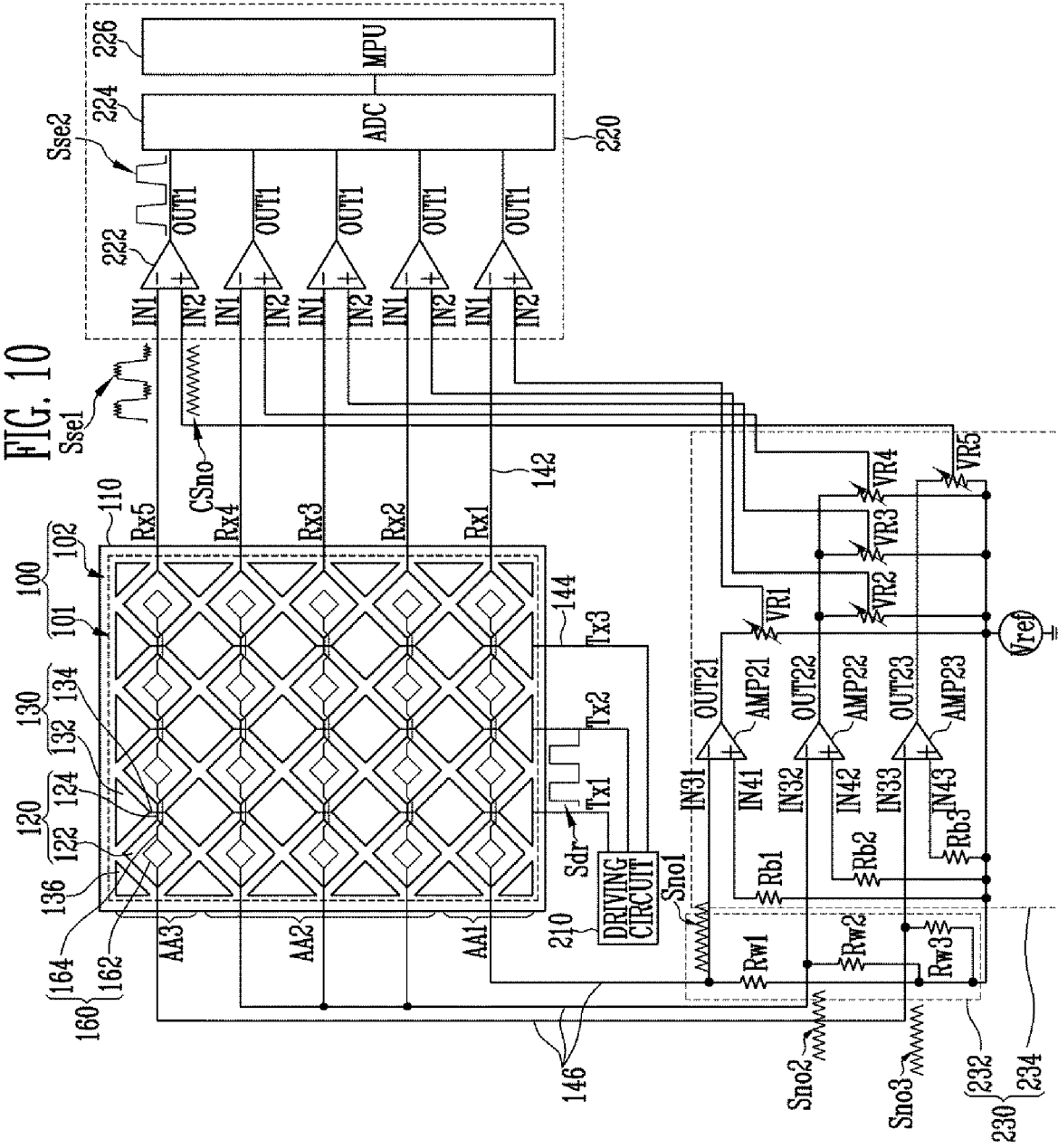
FIG. 10 illustrates a touch sensor according to an embodiment of the present disclosure.

FIG. 10 illustrates a touch sensor according to an embodiment of the present disclosure. For example, FIG. 10 illustrates a modification of the embodiment shown in FIG. 4. In FIG. 10, components similar or identical to those of FIG. 4 are designated by like reference numerals, and their detailed descriptions will be omitted.

Referring to FIG. 10, the amplifying circuit 234 may include a plurality of noise amplifiers AMP21, AMP22, and AMP23. As an example, the amplifying circuit 234 may include first to third noise amplifiers AMP21, AMP22, and AMP23 respectively corresponding to the first to third regions AA1, AA2, and AA3 of the sensor unit 100. In this case, the first, second, and third resistors Rw1, Rw2, and Rw3 of the input control unit 232 may be connected to first input terminals IN31, IN32, and IN33 of the first, second, and third noise amplifiers AMP21, AMP22, and AMP23, respectively.

For example, one end of the first resistor Rw1 may be connected to at least one sensing electrode 120 located in the first region AA1 and to the first input terminal (hereinafter, referred to as a "thirty-first input terminal IN31") of the first noise amplifier AMP21, and the other end of the first resistor Rw1 may be connected to the reference voltage source Vref. In addition, one end of the second resistor Rw2 may be connected to a plurality of sensing electrodes 120 located in the second region AA2 and to the first input terminal (hereinafter, referred to as a "thirty-second input terminal IN32") of the second noise amplifier AMP22, and the other end of the second resistor Rw2 may be connected to the reference voltage source Vref. In addition, one end of the third resistor Rw3 may be connected to at least one sensing electrode 120 located in the third region AA3 and to the first input terminal (hereinafter, referred to as a "thirty-third input terminal IN33") of the third noise amplifier AMP23, and the other end of the third resistor Rw3 may be connected to the reference voltage source Vref.

In some embodiments, second input terminals (hereinafter, respectively referred to as a "forty-first input terminal IN41," a "forty-second input terminal IN42," and a "forty-third input terminal IN43") of the first, second, and third noise amplifiers AMP21, AMP22, and AMP23 may be connected to the reference voltage source Vref via the respective input resistors Rb1, Rb2, and Rb3. In addition, output terminals OUT21, OUT22, and OUT23 of the first, second, and third noise amplifiers AMP21, AMP22, and AMP23 may be connected to second input terminals IN2 of at least one sensing channels 222 connected to sensing electrodes 120 of the respective first, second, and third regions AA1, AA2, and AA3 via at least one output resistor (at least one of VR1 to VR5). In some embodiments, one end of each of the output resistors VR1 to VR5 may be connected to an output terminal OUT21, OUT22, or OUT23 of any one among the first, second, and third noise amplifiers AMP21, AMP22, and AMP23, and the other end of each of the output resistors VR1 to VR5 may be connected to the reference voltage source Vref.

In the above-described embodiment, the first, second, and third noise amplifiers AMP21, AMP22, and AMP23 are configured to correspond to the respective regions of the sensor unit 100 (e.g., the respective first to third regions AA1, AA2, and AA3). In this case, although the magnitude (amplitude) of each noise signal Sno1, Sno2, or Sno3 increases, an optimum noise gain is easily set for each region AA1, AA2, or AA3, so that a display noise can be effectively removed. In addition, resistance values of the output resistors VR1 to VR5 are differentially set according to positions of the sensing electrodes 120 even in each of the regions AA1, AA2, and AA3, so that an optimum noise compensation signal CSno can be generated.

Figure 11:
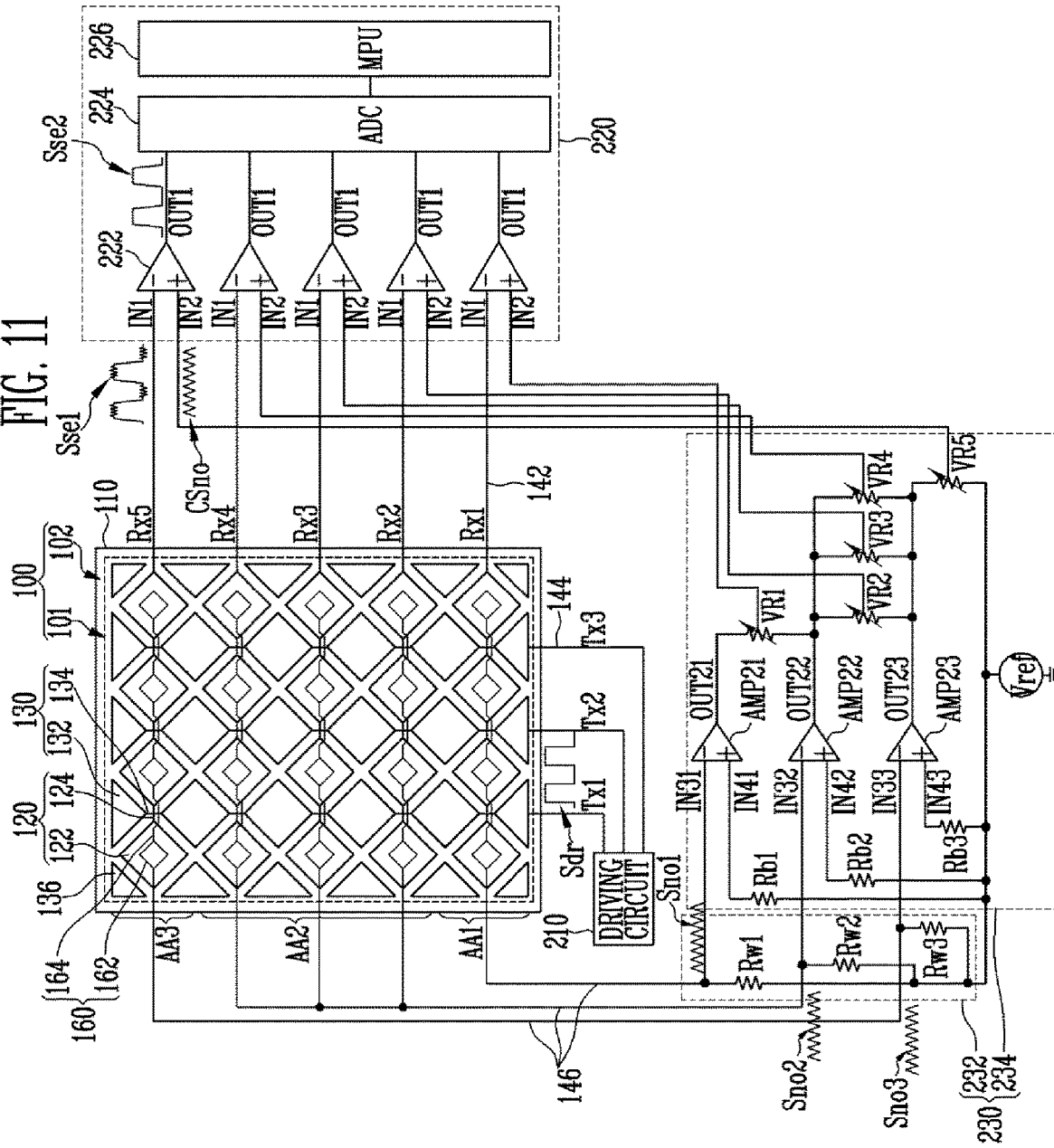
FIG. 11 illustrates a touch sensor according to an embodiment of the present disclosure.

FIG. 11 illustrates a touch sensor according to an embodiment of the present disclosure. For example, FIG. 11 illustrates a modification of the embodiment shown in FIG. 10. In FIG. 11, components similar to, or identical to, those of FIG. 10 are designated by like reference numerals, and their detailed descriptions will not be repeated.

Referring to FIG. 11, output resistors, e.g., the first output resistor VR1, the second to fourth resistors VR2 to VR4, and the fifth output resistor VR5, which correspond to the respective regions AA1, AA2, and AA3, may be connected to each other to be consecutively engaged. For example, one end of the first output resistor VR1 may be connected to the output terminal OUT21 of the first noise amplifier AMP21, and the other end of the first output resistor VR1 may be connected to the output terminal OUT22 of the second noise amplifier AMP22. In addition, respective ends of the second to fourth output resistors VR2 to VR4 may be commonly connected to the output terminal OUT22 of the second noise amplifier AMP22, and the other ends of the second to fourth output resistors VR2 to VR4 may be commonly connected to the output terminal OUT23 of the third noise amplifier AMP23. In addition, one end of the fifth output resistor VR5 may be connected to the output terminal OUT23 of the third noise amplifier AMP23, and the other end of the fifth output resistor VR5 may be connected to the reference voltage source Vref. Meanwhile, in another embodiment, when the sensor unit 100 is divided into only two regions (e.g., the first and second regions AA1 and AA2), the other ends of the second to fourth output resistors VR2 to VR4 may be commonly connected to the reference voltage source Vref.

According to the above-described embodiment, it is possible to prevent a rapid noise compensation variation from being generated at a boundary between the regions AA1, AA2, and AA3) of the sensor unit 100.

According to the present disclosure, a display noise introduced into the sensor unit 100 of the touch sensor from the display panel 300 can be effectively removed or reduced. Accordingly, the malfunction of the touch sensor can be reduced or minimized, and the sensing sensitivity of the touch sensor can be improved.

Further, according to the present disclosure, the sensor unit 100 is divided into a plurality of regions (e.g., the first to third regions AA1 to AA3) according to distribution characteristics of noise signals, and the noise detection electrodes 160 and the noise control unit 230 can be efficiently configured corresponding to the plurality of regions. Accordingly, it is possible to reduce or minimize an increase in size of the non-active region 102 and the touch driver 200 and an increase in manufacturing cost of the touch sensor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, with functional equivalents thereof to be included.

What is claimed is:

1. A display device comprising:
   a display panel comprising a display region in which a plurality of pixels is located, and a thin film encapsulation layer covering the display region;
   a sensor unit formed on the thin film encapsulation layer and comprising an active region overlapping with the display region; and
   a touch driver electrically connected to the sensor unit,
   wherein the sensor unit comprises:
      a first electrode extending in a first direction and comprising a plurality of first electrode cells electrically connected to each other; and
      a second electrode comprising a plurality of electrode parts respectively overlapping the first electrode cells and electrically connected to each other,
   wherein the touch driver is configured to generate a sensing signal with noise removed by compensating a sensing signal received from the first electrode based on noise signals received from the second electrode.

2. The display device of claim 1, wherein the active region comprises a first region comprising at least one pair of a first electrode and a second electrode, and a second region comprising at least two pairs of first electrodes and second electrodes, and
   wherein the noise signals comprise a first noise signal detected from the first region and a second noise signal detected from the second region.

3. A display device comprising:
   a display panel comprising a display region in which a plurality of pixels is located, and a thin film encapsulation layer covering the display region;
   a sensor unit formed on the thin film encapsulation layer and comprising an active region overlapping with the display region; and
   a touch driver electrically connected to the sensor unit,
   wherein the sensor unit comprises:
      a first electrode extending in a first direction and comprising a plurality of first electrode cells electrically connected to each other; and
      a second electrode comprising a plurality of electrode parts respectively overlapping the first electrode cells and electrically connected to each other,
   wherein the touch driver is to generate a sensing signal with noise removed by compensating a sensing signal received from the first electrode based on noise signals received from the second electrode,
   wherein the active region comprises a first region comprising at least one pair of a first electrode and a second electrode, and a second region comprising at least two pairs of first electrodes and second electrodes, wherein the noise signals comprise a first noise signal detected from the first region and a second noise signal detected from the second region, and
   wherein the touch driver comprises:
      a plurality of sensing channels each comprising first and second input terminals, wherein the first input terminals of the sensing channels are connected to different ones of the first electrodes;
      an amplifying circuit connected between the second input terminals of the sensing channels and the second electrodes; and
      an input control unit connected between the amplifying circuit and the second electrodes, the input control unit comprising a first resistor connected to the second electrode of the first region, and a second resistor commonly connected to the second electrodes of the second region.

4. The display device of claim 3, wherein the input control unit is configured to generate a representative noise signal close to a common mode noise of the sensing signal from the first and second noise signals by adjusting values of the first and second resistors.

5. The display device of claim 4, wherein the amplifying circuit is configured to amplify the representative noise signal, and is configured to provide a noise compensation signal corresponding to noise included in the sensing signal input to each of the plurality of sensing channels.

6. The display device of claim 5, wherein each of the plurality of sensing channels is configured to generate the sensing signal with noise removed by amplifying a signal corresponding to the difference between a voltage of the noise compensation signal input to the second input terminal and a voltage of the sensing signal input to the first input terminal.

7. The display device of claim 3, wherein the amplifying circuit comprises:
   an amplifier comprising an input terminal commonly connected to first ends of the first and second resistors; and
   a plurality of output resistors connected in parallel, connected to an output terminal of the amplifier, and respectively connected to different ones of the sensing channels.

8. The display device of claim 7, wherein the first resistor is connected to the second electrode of the first region and to the input terminal of the amplifier, and
   wherein the second resistor is connected between the second electrodes of the second region and the input terminal of the amplifier.

9. The display device of claim 7, wherein the second input terminals of the sensing channels are connected to respective ones of the output resistors.

10. The display device of claim 7, wherein the second region comprises at least three first electrodes, and
    wherein a second input terminal of a sensing channel connected to any one of the first electrodes of the second region is connected between second input terminals of sensing channels connected to two different ones of the first electrodes of the second region.

11. The display device of claim 7, wherein each of the output resistors comprises a variable resistor.

12. The display device of claim 3, wherein the amplifying circuit comprises:
    a first amplifier comprising an input terminal connected to the second electrode of the first region and to a first end of the first resistor, and an output terminal connected to a second input terminal of a sensing channel connected to the first electrode of the first region; and a second amplifier comprising an input terminal connected to the second electrodes of the second region and to a first end of the second resistor, and an output terminal connected to second input terminals of sensing channels connected to the first electrodes of the second region.

13. The display device of claim 12, wherein the amplifying circuit comprises:
   a first output resistor connected between the output terminal of the first amplifier and a second input terminal of a sensing channel connected to the first electrode of the first region; and
   a plurality of second output resistors connected between the output terminal of the second amplifier and second input terminals of the sensing channels connected to the second electrodes of the second region.

14. The display device of claim 13, wherein first ends of the first and second output resistors are connected to a reference voltage source.

15. The display device of claim 13, wherein a first end of the first output resistor is connected to the output terminal of the first amplifier, and a second end of the first output resistor is connected to the output terminal of the second amplifier.

16. The display device of claim 1, wherein the first electrode further comprises first connection parts connecting two neighboring first electrode cells to each other along the first direction, wherein the second electrode further comprises connection lines connecting two neighboring electrodes parts to each other along the first direction, the connection lines being insulated from the first connection parts, wherein the first electrode cells and the electrode parts are located at different layers, and wherein the first connecting parts and the connecting lines are located at a same layer.

17. The display device of claim 16, wherein the sensor unit further comprises a third electrode extending in a second direction to cross the first and second electrodes, wherein the third electrode further comprises a plurality of second electrode cells extending in the second direction and second connection parts connecting two neighboring second electrode cells to each other along the second direction, and wherein the first connecting parts and the second connecting parts are located at different layers.

18. The display device of claim 17, wherein the second electrode cells and the second connecting parts are located at a same layer.

19. The display device of claim 17, further comprising an insulating layer between the first connecting parts and the second connecting parts.

20. The display device of claim 17, wherein the first electrode cells, the electrodes parts and the second electrode cells comprise a metal mesh structure.

* * * * *